United States Patent
Yamazaki et al.

(10) Patent No.: US 9,299,296 B2
(45) Date of Patent: Mar. 29, 2016

(54) METHOD FOR DRIVING LIQUID CRYSTAL DISPLAY DEVICE

(71) Applicant: Semiconductor Energy Laboratory Co., Ltd., Atsugi-shi, Kanagawa-ken (JP)

(72) Inventors: Shunpei Yamazaki, Setagaya (JP); Jun Koyama, Sagamihara (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 210 days.

(21) Appl. No.: 13/949,258

(22) Filed: Jul. 24, 2013

(65) Prior Publication Data

US 2014/0028659 A1   Jan. 30, 2014

(30) Foreign Application Priority Data

Jul. 27, 2012   (JP) ................. 2012-167281

(51) Int. Cl.
| | |
|---|---|
| G09G 5/00 | (2006.01) |
| G09G 3/36 | (2006.01) |
| G11C 19/28 | (2006.01) |
| G02F 1/1368 | (2006.01) |
| H03K 17/30 | (2006.01) |

(52) U.S. Cl.
CPC ............... *G09G 3/36* (2013.01); *G02F 1/1368* (2013.01); *G09G 3/3677* (2013.01); *G11C 19/28* (2013.01); *G09G 2300/043* (2013.01); *G09G 2300/0408* (2013.01); *G09G 2300/0495* (2013.01); *G09G 2380/02* (2013.01); *H03K 17/302* (2013.01); *H03K 2217/0018* (2013.01)

(58) Field of Classification Search
CPC ............ H01L 29/7869; H01L 29/4908; H01L 29/78645; H01L 29/41733; H01L 29/786; H01L 21/02554; H01L 21/707; H01L 27/1251; H01L 27/3262; H03K 3/356121; G09G 3/36; G09G 3/3674; G09G 3/3677
See application file for complete search history.

(56) References Cited

U.S. PATENT DOCUMENTS

| | | | |
|---|---|---|---|
| 4,128,901 A | 12/1978 | Miller | |
| 5,165,075 A | 11/1992 | Hiroki et al. | |
| 5,844,535 A | 12/1998 | Itoh et al. | |
| 5,923,320 A | 7/1999 | Murakami et al. | |
| 6,118,417 A | 9/2000 | Hush | |
| 6,751,745 B1 | 6/2004 | Yoshimura et al. | |
| 2008/0079685 A1* | 4/2008 | Umezaki et al. | ............. 345/100 |
| 2011/0012112 A1 | 1/2011 | Yamazaki et al. | |

(Continued)

FOREIGN PATENT DOCUMENTS

JP    2011-077503 A    4/2011

*Primary Examiner* — Lixi C Simpson
(74) *Attorney, Agent, or Firm* — Robinson Intellectual Property Law Office; Eric J. Robinson

(57) ABSTRACT

A liquid crystal material is prevented from being degraded by a voltage to control the shift of the threshold voltage which is applied to a back gate on the same conductive film as a pixel electrode. A liquid crystal display device includes a pixel circuit including a pixel electrode which applies an electric field to a liquid crystal layer; and a driver circuit including a transistor including a first gate and a second gate with a semiconductor film interposed therebetween. The transistor overlaps with the liquid crystal layer. A signal for controlling on/off of the transistor is input to the first gate. A signal for applying a first voltage is input to the second gate in a gate line selection period. A signal for alternately applying the first voltage and a second voltage is input to the second gate in a vertical retrace period.

14 Claims, 10 Drawing Sheets

(56) References Cited

U.S. PATENT DOCUMENTS

| | | |
|---|---|---|
| 2011/0032444 A1* | 2/2011 | Yamazaki et al. .......... 349/42 |
| 2011/0199364 A1 | 8/2011 | Yamazaki et al. |
| 2011/0216048 A1 | 9/2011 | Koyama et al. |
| 2012/0033488 A1 | 2/2012 | Nagatsuka et al. |
| 2012/0050086 A1 | 3/2012 | Ito |
| 2012/0300151 A1 | 11/2012 | Yamazaki et al. |

* cited by examiner

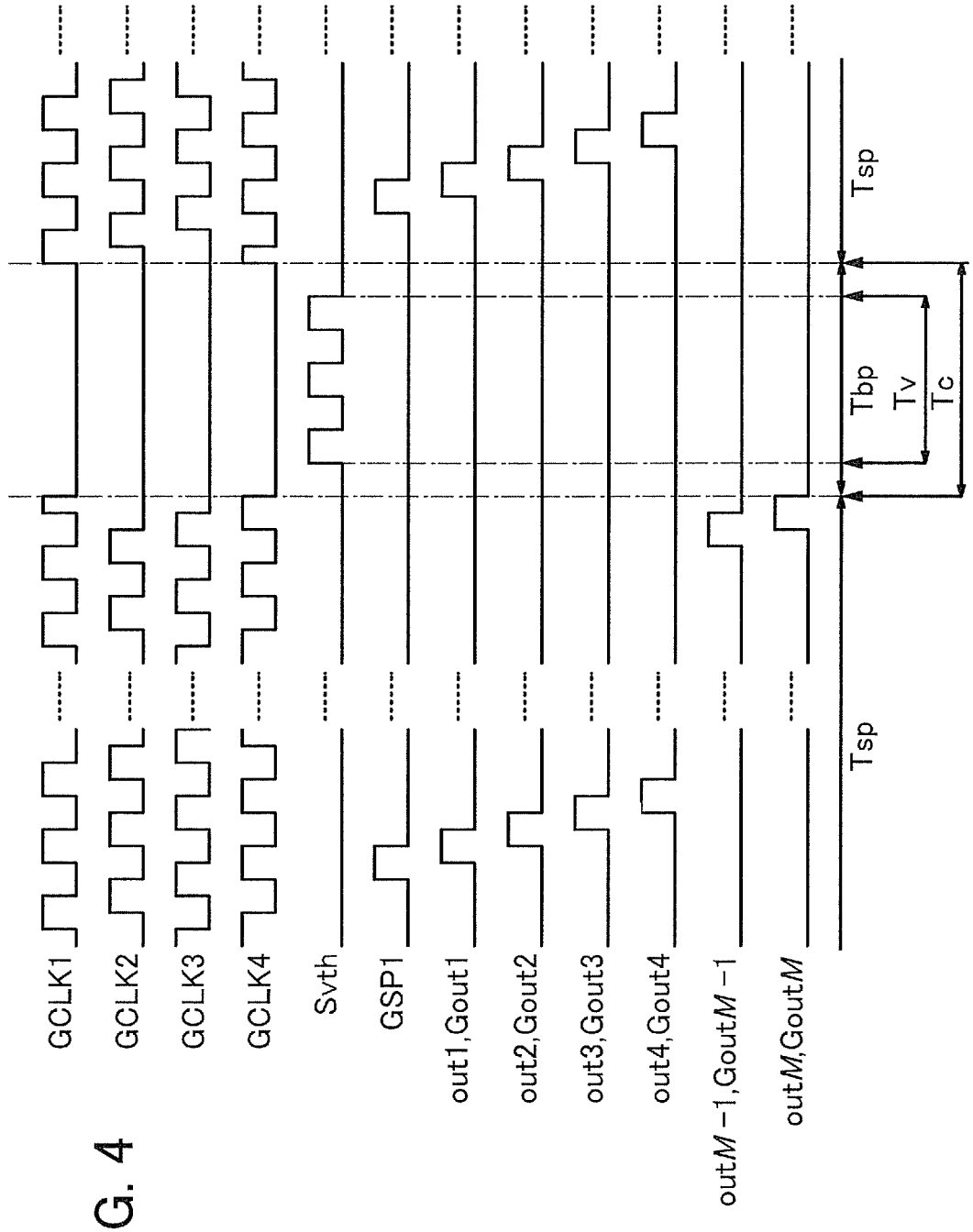

METHOD FOR DRIVING LIQUID CRYSTAL DISPLAY DEVICE

BACKGROUND OF THE INVENTION

1. Field of the Invention

The present invention relates to a liquid crystal display device and a method for driving the liquid crystal display device.

2. Description of the Related Art

Liquid crystal display devices have been commoditized as a result of recent technological innovation, and development thereof has been actively promoted for higher value-added products.

One of the added values for liquid crystal display devices is a reduced frame width around a display area, that is so-called a slim border. The slim border can be achieved in such a manner that transistors in a driver circuit are manufactured over the same substrate as transistors in a pixel circuit in the same process.

For a semiconductor layer of the transistor in the driver circuit, an oxide semiconductor is preferably used because of, for example, easy cost saving due to its productivity which is expected to be as high as that of amorphous silicon. Disclosed in Patent Document 1 is the structure in which transistors in a driver circuit are manufactured over the same substrate as transistors in a pixel circuit in the same process.

REFERENCE

Patent Document

[Patent Document 1] Japanese Published Patent Application No. 2011-77503

SUMMARY OF THE INVENTION

The electrical characteristics of a transistor in a driver circuit need to be less degraded than those of a transistor in a pixel circuit. Specifically, in Patent Document 1, a back gate is provided for the transistor in the driver circuit as a countermeasure against degradation of electrical characteristics, such as a shift of the threshold voltage.

In Patent Document 1, the back gate of the transistor in the driver circuit is formed using the same conductive film as a pixel electrode connected to the transistor in the pixel circuit, so as to prevent an increase in the number of photomasks necessary for the production. The structure disclosed in Patent Document 1, however, has a problem in that a liquid crystal material on the back gate is degraded by a voltage which is applied to the back gate to control the shift of the threshold voltage.

In view of the above, an object of one embodiment of the present invention is to provide a liquid crystal display device in which a liquid crystal material is prevented from being degraded by a voltage which is applied to a back gate formed using the same conductive film as a pixel electrode and which controls the shift of the threshold voltage, and to provide a method for driving the liquid crystal display device.

One embodiment of the present invention is a method for driving a liquid crystal display device including a pixel circuit and a driver circuit. The pixel circuit includes a pixel electrode which applies an electric field to a liquid crystal layer. The driver circuit includes a transistor having a first gate and a second gate which is formed using the same layer as the pixel electrode and faces the first gate with a semiconductor film interposed therebetween, the transistor overlapping with the liquid crystal layer. A signal for controlling the on/off of the transistor is input to the first gate. A signal for applying a first voltage is input to the second gate in a gate line selection period. A signal for alternately applying the first voltage and a second voltage is input to the second gate in a vertical retrace period.

One embodiment of the present invention is a method for driving a liquid crystal display device including a pixel circuit and a driver circuit. The pixel circuit includes a pixel electrode which applies an electric field to a liquid crystal layer. The driver circuit includes a transistor having a first gate and a second gate which is formed using the same layer as the pixel electrode and faces the first gate with a semiconductor film interposed therebetween, the transistor overlapping with the liquid crystal layer. A signal for controlling the on/off of the transistor is input to the first gate. A signal for applying a first voltage is input to the second gate in a gate line selection period. A signal for alternately applying the first voltage and a second voltage is input to the second gate in a vertical retrace period. In the vertical retrace period, input of a clock signal to the driver circuit is stopped.

In the method for driving the liquid crystal display device according to one embodiment of the present invention, the first voltage is preferably a voltage which allows the threshold voltage of the transistor to shift in the positive direction.

In the method for driving the liquid crystal display device according to one embodiment of the present invention, the first voltage is preferably a ground voltage or a low power source voltage, and the second voltage is preferably a high power source voltage.

In the method for driving the liquid crystal display device according to one embodiment of the present invention, the semiconductor film is preferably an oxide semiconductor film.

According to one embodiment of the present invention, it is possible to reduce degradation of a liquid crystal material caused by a voltage which is applied to a back gate formed using the same conductive film as a pixel electrode and which controls the shift of the threshold voltage.

BRIEF DESCRIPTION OF THE DRAWINGS

In the accompanying drawings:

FIG. 4 is a timing chart for explaining a liquid crystal display device;

DETAILED DESCRIPTION OF THE INVENTION

Figure 1A:
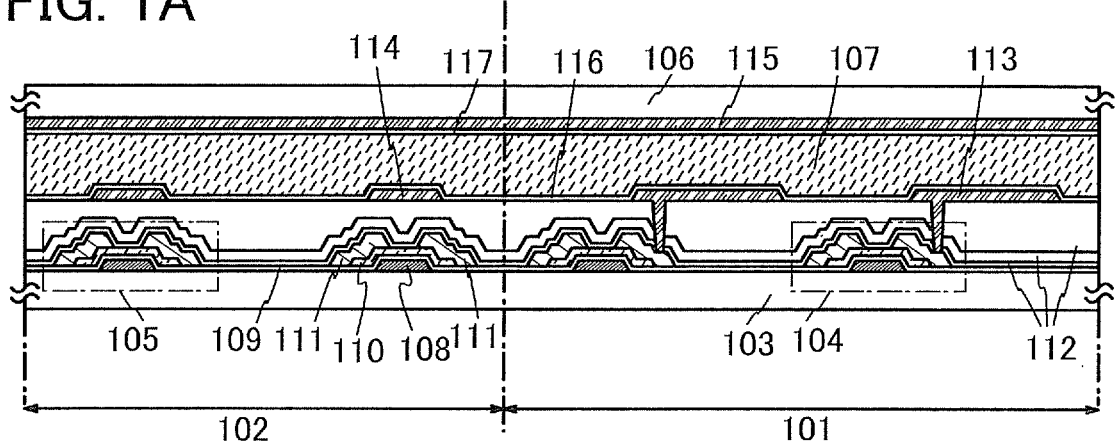
FIGS. 1A to 1C are respectively a cross-sectional view, a circuit diagram, and a timing chart for explaining a liquid crystal display device.

Hereinafter, embodiments of the present invention will be described in detail with reference to the accompanying drawings. Note that the present invention is not limited to the description below, and it is easily understood by those skilled in the art that modes and details of the present invention can be modified in various ways. Accordingly, the present invention should not be construed as being limited to the description of the embodiments below.

Note that the size, the thickness of a layer, the waveform of a signal, and a region of each structure shown in the drawings and the like in the embodiments are exaggerated for simplicity in some cases. Therefore, embodiments of the present invention are not limited to such scales.

The ordinal number such as first, second, third, and N-th (N is a natural number) are used to avoid confusion among components, and the terms do not limit the components numerically.

In this specification, the term "parallel" indicates that the angle between two straight lines is greater than or equal to −10° and less than or equal to 10°, and accordingly includes the case where the angle is greater than or equal to −5° and less than or equal to 5°. In addition, the term "perpendicular" indicates that the angle between two straight lines is greater than or equal to 80° and less than or equal to 100°, and accordingly includes the case where the angle is greater than or equal to 85° and less than or equal to 95°.

In this specification, the trigonal and rhombohedral crystal systems are included in the hexagonal crystal system.

(Embodiment 1)

In this embodiment, one mode of a liquid crystal display device and one mode of a method for driving the liquid crystal display device will be described with reference to FIGS. 1A to 1C, FIGS. 2A and 2B, FIGS. 3A to 3C, FIG. 4, and FIGS. 5A and 5B.

Before the description of the method for driving the liquid crystal display device according to this embodiment, structures of a pixel circuit and a driver circuit included in the liquid crystal display device will be described.

FIG. 1A is an example of a cross-sectional view of transistors included in a pixel circuit and a driver circuit of the liquid crystal display device.

In FIG. 1A, a transistor 104 over a substrate 103 is shown in part of a cross-sectional view of a pixel circuit 101, and a transistor 105 over the substrate 103 is shown in part of a cross-sectional view of a driver circuit 102. A substrate 106 is provided so as to face the substrate 103. A liquid crystal layer 107 is provided between the substrate 103 and the substrate 106.

The transistors 104 and 105 over the substrate 103 each include a conductive film 108 serving as a gate (also referred to as a first gate), an insulating film 109 serving as a gate insulating film, a semiconductor film 110, and a conductive film 111 serving as a source or a drain.

Insulating films 112 serving as interlayer insulating films are provided over the transistors 104 and 105. Note that the insulating films 112 may include stacked films serving as barrier layers which prevent external impurities from entering the transistors 104 and 105.

Over the insulating films 112 in the pixel circuit 101, a conductive film 113 serving as a pixel electrode (also referred to as a first electrode) is provided to be connected to the conductive film 111 in the transistor 104 through an opening. Over the insulating films 112 in the driver circuit 102, a conductive film 114 serving as a back gate (also referred to as a second gate) of the transistor 105 in the driver circuit 102 is provided. An insulating film 116 serving as an alignment film of the liquid crystal layer is provided over the conductive films 113 and 114.

In the transistor 105, the conductive film 108 serving as the first gate faces the conductive film 114 serving as the second gate with the semiconductor film 110 interposed therebetween.

In the structure of one embodiment of the present invention, the transistor 105 in the driver circuit 102 includes a back gate. When the back gate is provided for the transistor 105 in the driver circuit 102 and a voltage applied to the conductive film 114 serving as the back gate is controlled, the threshold voltage of the transistor can be controlled to a desired value. Hence, the reliability of the liquid crystal display device can be further improved by the control of threshold voltage using the back gate.

In the transistor 105 in the driver circuit 102, the control of threshold voltage using the back gate is important because variation in the electrical characteristics of the transistor 105 might cause malfunction which significantly affects the display quality.

Note that as shown in FIG. 1A, the conductive films 113 and 114 are formed using the same layer. Accordingly, the conductive films 113 and 114 can be formed by processing one conductive film to a desired shape by etching or the like. As a result, the conductive film 114 serving as the back gate can be obtained without increasing the number of photomasks and thus without increasing the number of manufacturing steps of the liquid crystal display device.

In FIG. 1A, the conductive film 108, the insulating film 109, the semiconductor film 110, the conductive film 111, and the insulating films 112 each are a single-layer film; however, they may each be a multi-layer film.

A conductive film 115 (also referred to as a second electrode) is provided on the substrate 106 in the pixel circuit 101. A liquid crystal element can be formed by the conductive film 113, the conductive film 115, and the liquid crystal layer 107 interposed therebetween. The liquid crystal layer 107 controls light from a backlight in response to an electric field generated by a voltage applied between the conductive films 113 and 115. Note that the conductive film 115 serving as the second electrode of the liquid crystal element is not necessarily provided on the substrate 106, and may be provided on the substrate 103 or on both the substrate 103 and the substrate 106. An insulating film 117 serving as an alignment film of the liquid crystal layer is provided on the conductive film 115.

Note that the liquid crystal layer 107 is provided inside a sealing member for sealing a liquid crystal material. The sealing member is provided outside the pixel circuit 101 and the driver circuit 102. Accordingly, as shown in FIG. 1A, the liquid crystal layer 107 is provided to cover the pixel circuit 101 included in the liquid crystal element and the driver circuit 102, and the transistor 105 in the driver circuit 102 overlaps with the liquid crystal layer 107.

Before the description of the method for driving the liquid crystal display device according to this embodiment, description will be made on signals transmitted to the pixel circuit and the driver circuit in the liquid crystal display device.

Figure 1B:
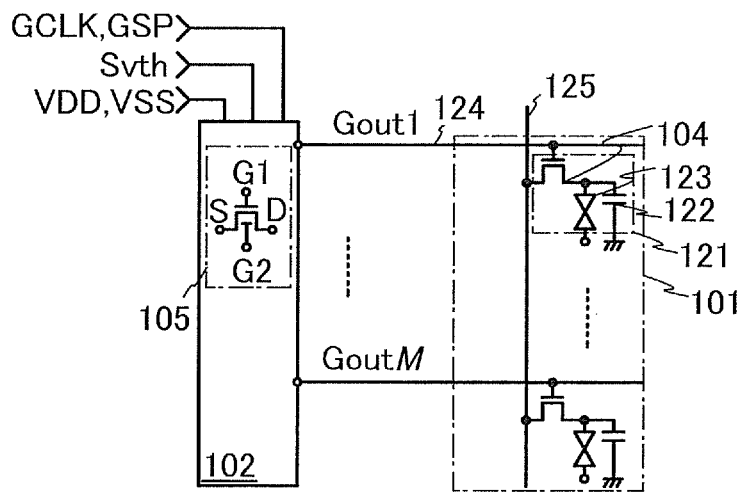

FIG. 1B is an example of a circuit diagram of a pixel including the transistor 104 in the pixel circuit 101 shown in FIG. 1A and a circuit diagram including the transistor 105 in the driver circuit 102 shown in FIG. 1A.

Note that in the description of this embodiment, a gate line driver circuit is particularly shown as the driver circuit 102. Note that a transistor in a data line driver circuit may be manufactured over the same substrate as the transistor in the gate line driver circuit in the same process.

A pixel 121 in the pixel circuit 101 shown in FIG. 1B includes the transistor 104, a capacitor 122, and a liquid crystal element 123. A gate of the transistor 104 is connected to a gate line 124, and one of a source and a drain of the transistor 104 is connected to a data line 125. The other of the source and the drain of the transistor 104 is connected to one electrode of the capacitor 122 and a first electrode of the liquid crystal element 123. The other electrode of the capacitor 122 is connected to a capacitor line. A second electrode of the liquid crystal element 123 is connected to a common line supplying a common voltage Vcom.

In the driver circuit 102 shown in FIG. 1B, which is a gate line driver circuit, a shift register can be formed by combining a plurality of transistors 105. From the shift register, scan signals Gout1 to GoutM (M is a natural number) are sequentially output to M gate lines 124. The shift register is supplied with a gate line clock signal GCLK, a gate line start pulse GSP, a threshold voltage control signal Svth, a high power source voltage VDD, and a low power source voltage VSS.

The transistor 105 in the driver circuit 102 shown in FIG. 1B can be represented by a four-terminal element, specifically, by a circuit symbol with a first gate G1, a second gate G2 serving as a back gate, a source S, and a drain D as shown in FIG. 1B.

The first gate G1, the source S, and the drain D are connected to any of wirings supplying the gate line clock signal GCLK, the gate line start pulse GSP, and the high power source voltage VDD or the low power source voltage VSS, or any of the first gate G1, the source S, and the drain D of another transistor 105. The transistor is switched on or off in response to a signal input to the first gate G1 from the wiring connected thereto.

Note that in response to the gate line clock signal GCLK and the gate line start pulse GSP, scan signals are output from the shift register in the driver circuit 102. The gate line clock signal GCLK may be plural signals having different phases. The high power source voltage VDD and the low power source voltage VSS supply a power source voltage to the driver circuit.

The second gate G2 is connected to a wiring supplying the threshold voltage control signal Svth. In a period during which a scan signal is output to select a gate line, a first voltage V1 is applied to the second gate G2 by the threshold voltage control signal Svth. In a vertical retrace period, the first voltage V1 and a second voltage V2 are alternately applied to the second gate G2 by the threshold voltage control signal Svth.

When the first voltage V1 is applied by the threshold voltage control signal Svth, the threshold voltage of the transistor is controlled to a desired value. Alternate application of the first voltage V1 and the second voltage V2 results in less degradation of a liquid crystal material included in the liquid crystal layer.

Note that the on/off of the transistor 105 in the driver circuit 102 becomes difficult to control if the threshold voltage of the transistor 105 shifts in the negative direction. Hence, the first voltage V1 applied by the threshold voltage control signal Svth in a period during which a scan signal is output to select a gate line is preferably a voltage which allows the threshold voltage of the transistor 105 to shift in the positive direction. The voltage allowing the threshold voltage of the transistor 105 to shift in the positive direction may be a ground voltage GND or a low power source voltage VSS, for example.

The voltage allowing the threshold voltage of the transistor 105 to shift in the positive direction is preferably, for example, a low-level signal (L signal) of the gate line clock signal GCLK, the low power source voltage VSS, or the ground voltage, which has the lowest potential in the driver circuit 102; however, a voltage lower than these voltages may also be used. When a voltage lower than that of the first gate G1 is applied to the second gate G2, the threshold voltage of the transistor 105 shifts in the positive direction. The amount of shift of the threshold voltage increases with a reduction in the voltage applied to the second gate G2. Hence, even when the threshold voltage of the transistor 105 shifts in the negative direction because of degradation of electrical characteristics, the threshold voltage can be made to shift in the positive direction by the control of the voltage applied to the second gate G2.

In order that the threshold voltage of the transistor 105 in the driver circuit 102 is allowed to shift in the positive direction, a constant voltage is applied to the conductive film 114 serving as the back gate in a certain period, which might cause degradation of the liquid crystal material of the liquid crystal layer 107 overlapping with the transistor 105. The degradation of the liquid crystal material can be reduced by applying an alternate-current (AC) voltage. Therefore, the second voltage V2 applied by the aforementioned threshold voltage control signal Svth is preferably the high power source voltage VDD. An AC voltage can be applied to the liquid crystal material when the first voltage V1 and the second voltage V2 are alternately applied by threshold voltage control signal Svth in the vertical retrace period, resulting in a reduction in the degradation of the liquid crystal material.

Note that the aforementioned common voltage Vcom is preferably a voltage between the first voltage V1 and the second voltage V2, specifically, a voltage intermediate between the high power source voltage VDD and the low power source voltage VSS. In the case where the low power source voltage VSS is the ground voltage, the common voltage is preferably ½VDD.

Next, the method for driving the liquid crystal display device according to this embodiment will be described.

Figure 1C:
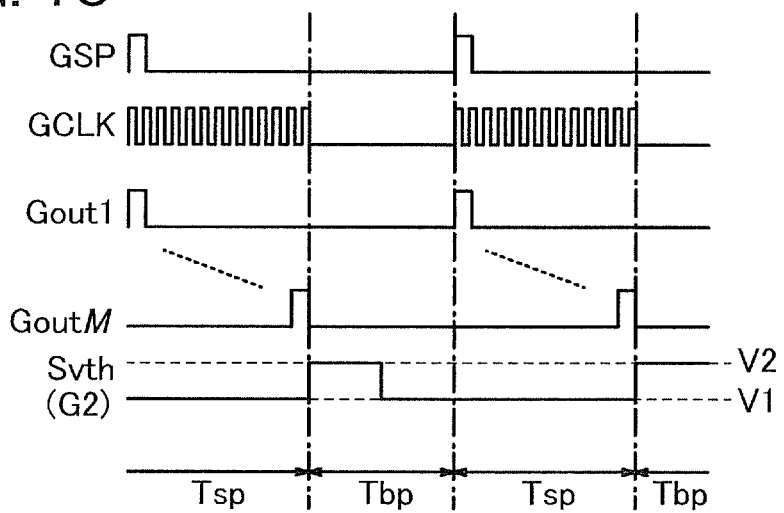

FIG. 1C is a timing chart of the gate line clock signal GCLK, the gate line start pulse GSP, the threshold voltage control signal Svth, and the scan signals Gout1 to GoutM which are shown in FIG. 1B.

In the timing chart shown in FIG. 1C, a period Tsp is a gate line selection period during which pixels of each row are selected by the scan signals Gout1 to GoutM. Also in the timing chart shown in FIG. 1C, a period Tbp is a vertical retrace period that is a blank period after a sequential output of scan signals to the first to the M-th gate lines until an output of a scan signal to the first gate line starts again.

In the method for driving the liquid crystal display device according to this embodiment, in the period Tsp, the scan signals Gout1 to GoutM are sequentially output by the gate line clock signal GCLK and the gate line start pulse GSP, and the first voltage V1 can be applied to the back gate by the threshold voltage control signal Svth. In the period Tbp, the gate line clock signal GCLK is fixed to the L signal so as to stop the oscillation of the signals, and the first voltage V1 and the second voltage V2 can be alternately applied to the back gate by the threshold voltage control signal Svth.

With use of the above method for driving the liquid crystal display device, a voltage which controls the shift of the threshold voltage of the transistor can be applied in the gate line selection period. In addition, it is possible to reduce degradation of the liquid crystal material caused by a voltage which is applied to the back gate formed using the same conductive film as the pixel electrode and which controls the shift of the threshold voltage.

Figure 2A:
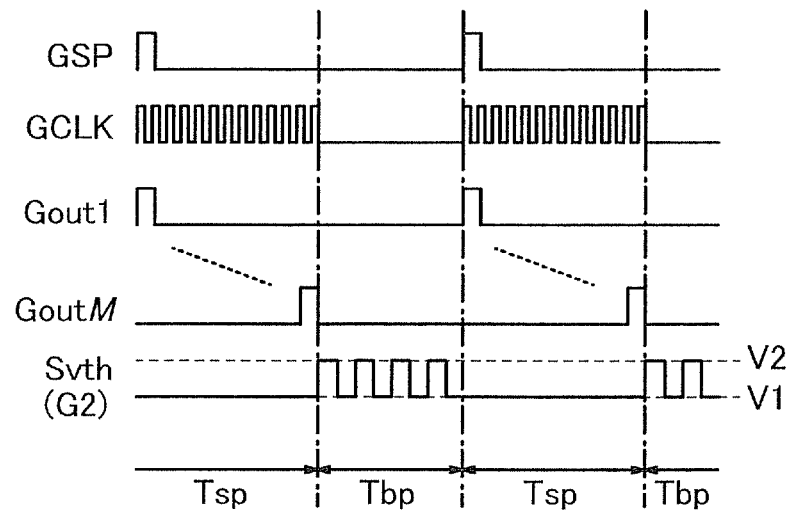
FIGS. 2A and 2B are timing charts for explaining a liquid crystal display device.

The alternate application of the first voltage V1 and the second voltage V2, which is performed in the period Tbp by the threshold voltage control signal Svth as shown in FIG. 1C, may be performed in such a manner that the voltage oscillates plural times as shown in FIG. 2A.

Figure 2B:
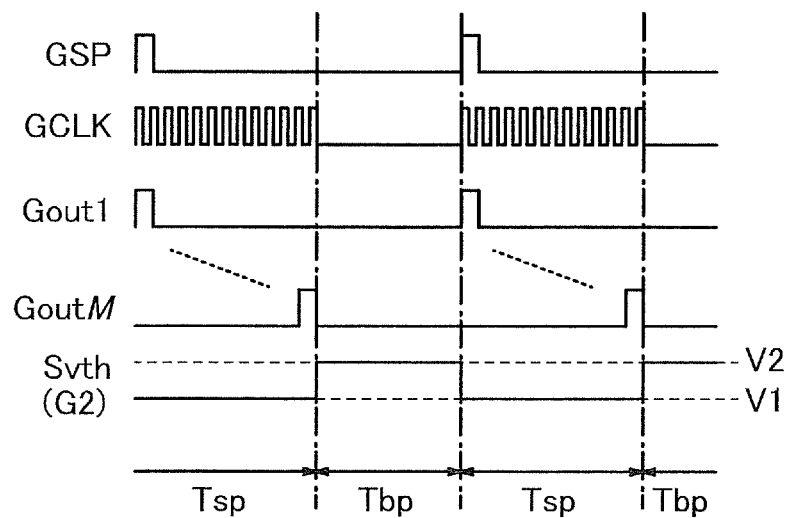

Alternatively, the second voltage V2 shown in FIG. 1C may be applied continuously over the period Tbp by the threshold voltage control signal Svth. Specifically, as shown in FIG. 2B, the second voltage V2 is applied in the period Tbp, so that degradation of the liquid crystal material is reduced by utilizing the signal rise from the first voltage V1 to the second voltage V2 and the signal fall from the second voltage V2 to the first voltage V1 at the time of switching between the period Tsp and the period Tbp.

The method for driving the liquid crystal display device will be further explained while showing an example of a circuit configuration of a pulse signal output circuit and a shift register including the pulse signal output circuit. The pulse signal output circuit includes the transistor with the back gate which is provided in the gate line driver circuit shown in FIGS. 1A to 1C.

First, an example of the circuit configuration of the pulse signal output circuit and the shift register including the pulse signal output circuit will be described with reference to FIGS. 3A to 3C.

Figure 3A:
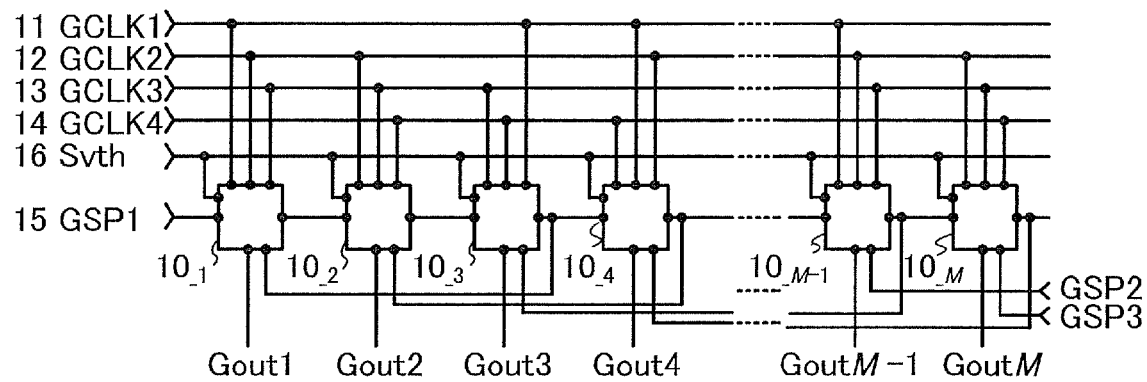
FIGS. 3A and 3B are block diagrams and FIG. 3C is a circuit diagram, each showing a liquid crystal display device.

The shift register includes a first pulse signal output circuit $10\_1$ to an M-th pulse signal output circuit $10\_M$, signal lines 11 to 14 for transmitting the gate line clock signals GCLK, and a signal line 16 for transmitting the threshold voltage control signal Svth (see FIG. 3A). Gate line clock signals GCLK1 to GCLK4 are respectively supplied to the signal lines 11 to 14. The threshold voltage control signal Svth is supplied to the signal line 16.

The clock signal oscillates between High level (H signal) and Low level (L signal) at regular intervals. Here, the gate line clock signals GCLK1 to GCLK4 are each delayed by ¼ period. In the circuits shown in FIGS. 3A to 3C, these clock signals are utilized to control the pulse signal output circuits, for example.

Figure 3B:
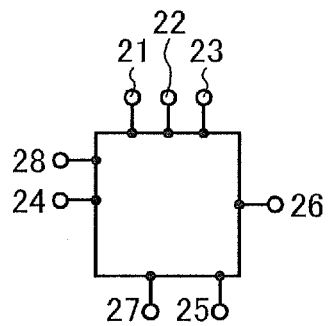

Each of the first pulse signal output circuit $10\_1$ to the M-th pulse signal output circuit $10\_M$ includes an input terminal 21, an input terminal 22, an input terminal 23, an input terminal 24, an input terminal 25, an output terminal 26, an output terminal 27, and an input terminal 28 (see FIG. 3B).

Each of the input terminals 21 to 23 is connected to any of the signal lines 11 to 14. For example, in the first pulse signal output circuit $10\_1$, the input terminals 21 to 23 are connected to the signal lines 11 to 13, respectively. In the second pulse signal output circuit $10\_2$, the input terminals 21 to 23 are connected to the signal lines 12 to 14, respectively. Although the M-th pulse signal output circuit $10\_M$ is connected to the signal lines 12 to 14, the structure shown here is just an example because the signal lines connected to the M-th pulse signal output circuit $10\_M$ vary with the number of M.

In an m-th pulse signal output circuit (m is a natural number greater than or equal to 3) of the shift register described in this embodiment, the input terminal 24 is connected to the output terminal 26 of the (m−1)th pulse signal output circuit; the input terminal 25 is connected to the output terminal 26 of the (m+2)th pulse signal output circuit; the output terminal 26 is connected to the input terminal 24 of the (m+1)th pulse signal output circuit and the input terminal 25 of the (m−2)th pulse signal output circuit; the output terminal 27 outputs a signal to a Gout(m); and the input terminal 28 is connected to the signal line 16.

In the first pulse signal output circuit $10\_1$, a gate line start pulse (GSP1) is input from a signal line 15 to the input terminal 24. In a k-th pulse signal output circuit $10\_k$ (k is a natural number greater than or equal to 2 and less than or equal to M), a pulse output from the previous stage is input to the input terminal 24. In the (M−1)th pulse signal output circuit $10\_{(M-1)}$, a gate line start pulse (GSP2) is input to the input terminal 25. In the M-th pulse signal output circuit $10\_M$, a gate line start pulse (GSP3) is input to the input terminal 25. The gate line start pulse (GSP2) and the gate line start pulse (GSP3) may be input from the outside or generated inside the circuit.

Next, the configuration of the first pulse signal output circuit $10\_1$ to the M-th pulse signal output circuit $10\_M$ will be specifically described.

Figure 3C:
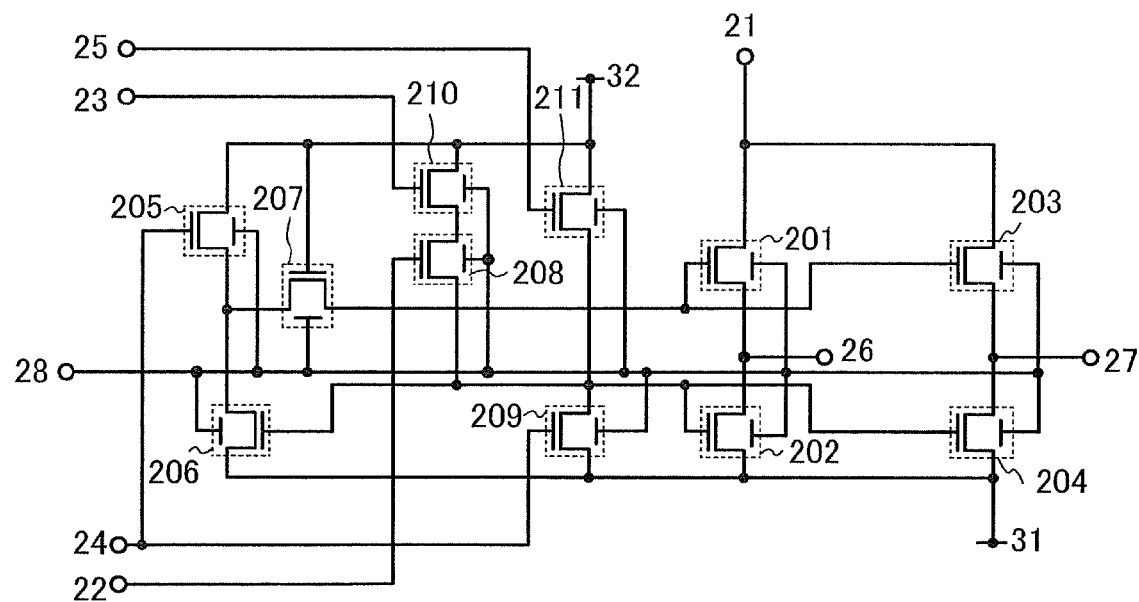

Each of the first pulse signal output circuit $10\_1$ to the M-th pulse signal output circuit $10\_M$ includes transistors 201 to 211 as shown in FIG. 3C.

The transistors 201 to 211 each include the terminals of the first gate, the second gate, the source, and the drain shown in FIG. 1B. Note that in the description below, the terminal of the first gate is referred to as a first gate terminal, the terminal of the second gate is referred to as a second gate terminal, the terminal of one of the source and the drain is referred to as a first terminal, and the terminal of the other of the source and the drain is referred to as a second terminal.

The configuration of the pulse signal output circuit shown in FIG. 3C will be described.

The first terminal of the transistor 201 is connected to the input terminal 21, the second terminal of the transistor 201 is connected to the output terminal 26, the first gate terminal of the transistor 201 is connected to the second terminal of the transistor 207, and the second gate terminal of the transistor 201 is connected to the input terminal 28.

The first terminal of the transistor 202 is connected to the output terminal 26, the second terminal of the transistor 202 is connected to a power source line 31, the first gate terminal of the transistor 202 is connected to the second terminal of the transistor 208, and the second gate terminal of the transistor 202 is connected to the input terminal 28.

The first terminal of the transistor 203 is connected to the input terminal 21, the second terminal of the transistor 203 is connected to the output terminal 27, the first gate terminal of the transistor 203 is connected to the second terminal of the transistor 207, and the second gate terminal of the transistor 203 is connected to the input terminal 28.

The first terminal of the transistor 204 is connected to the output terminal 27, the second terminal of the transistor 204 is connected to the power source line 31, the first gate terminal of the transistor 204 is connected to the second terminal of the transistor 208, and the second gate terminal of the transistor 204 is connected to the input terminal 28.

The first terminal of the transistor 205 is connected to a power source line 32, the second terminal of the transistor 205 is connected to the first terminal of the transistor 206 and the first terminal of the transistor 207, the first gate terminal of the transistor 205 is connected to the input terminal 24, and the second gate terminal of the transistor 205 is connected to the input terminal 28.

The first terminal of the transistor 206 is connected to the second terminal of the transistor 205 and the first terminal of the transistor 207, the second terminal of the transistor 206 is connected to the power source line 31, the first gate terminal of the transistor 206 is connected to the second terminal of the transistor 208, and the second gate terminal of the transistor 206 is connected to the input terminal 28.

The first terminal of the transistor 207 is connected to the second terminal of the transistor 205 and the first terminal of the transistor 206, the second terminal of the transistor 207 is connected to the first gate terminal of the transistor 201 and the first gate terminal of the transistor 203, the first gate terminal of the transistor 207 is connected to the power source line 32, and the second gate terminal of the transistor 207 is connected to the input terminal 28.

The first terminal of the transistor 208 is connected to the second terminal of the transistor 210, the second terminal of the transistor 208 is connected to the first gate terminal of the transistor 202, the first gate terminal of the transistor 204, and the first gate terminal of the transistor 206, the first gate terminal of the transistor 208 is connected to the input terminal 22, and the second gate terminal of the transistor 208 is connected to the input terminal 28.

The first terminal of the transistor 209 is connected to the second terminal of the transistor 208, the second terminal of the transistor 209 is connected to the power source line 31, the first gate terminal of the transistor 209 is connected to the input terminal 24, and the second gate terminal of the transistor 209 is connected to the input terminal 28.

The first terminal of the transistor 210 is connected to the power source line 32, the second terminal of the transistor 210 is connected to the first terminal of the transistor 208, the first gate terminal of the transistor 210 is connected to the input terminal 23, and the second gate terminal of the transistor 210 is connected to the input terminal 28.

The first terminal of the transistor 211 is connected to the power source line 32, the second terminal of the transistor 211 is connected to the second terminal of the transistor 208, the first gate terminal of the transistor 211 is connected to the input terminal 25, and the second gate terminal of the transistor 211 is connected to the input terminal 28.

One embodiment of the present invention is not limited to the aforementioned configuration of the pulse signal output circuit which is just an example.

In the case where the pulse signal output circuit in FIG. 3C is the first pulse signal output circuit $10\__1$ in FIG. 3A, the gate line clock signal GCLK1 is input to the input terminal 21, the gate line clock signal GCLK2 is input to the input terminal 22, the gate line clock signal GCLK3 is input to the input terminal 23, the gate line start pulse GSP1 is input to the input terminal 24, and an output signal (denoted by out3) of the third pulse signal output circuit $10\__3$ is input to the input terminal 25. An output signal (denoted by out1) of the first pulse signal output circuit $10\__1$ is output from the output terminal 26 to the input terminal 24 of the second pulse signal output circuit $10\__2$. A scan signal Gout1 is output from the output terminal 27. The threshold voltage control signal Svth is input to the input terminal 28. Note that the H signal and the L signal which are supplied to each input terminal are VDD and VSS, respectively.

The low power source voltage VSS is applied to the power source line 31, and the high power source voltage VDD is applied to the power source line 32.

The operation of the transistors 201 to 211, such as turning on or off, affects the signal out1 output from the output terminal 26 and the scan signal Gout1 output from the output terminal 27. Thus, as shown in FIGS. 1A to 1C, the transistor in the driver circuit according to this embodiment includes the second gate serving as the back gate and a voltage for controlling the shift of the threshold voltage of the transistor is applied in a gate line selection period, whereby the signal out1 and the scan signal Gout1 can be less affected by degradation of the electrical characteristics of the transistors 201 to 211. In addition, as shown in FIGS. 1A to 1C, in the transistor in the driver circuit according to this embodiment, it is possible to reduce degradation of the liquid crystal material caused by a voltage which is applied to the back gate formed using the same conductive film as the pixel electrode and which controls the shift of the threshold voltage.

Next, the operation of the shift register shown in FIGS. 3A to 3C will be described with reference to the timing chart of FIG. 4. Note that in the timing chart of FIG. 4, the transistors 201 to 211 are all n-channel transistors.

In the timing chart of FIG. 4, GCLK1 to GCLK4 denote gate line clock signals, Svth denotes a threshold voltage control signal, GSP1 denotes a gate line start pulse, Gout1 to GoutM denote outputs from the output terminal 27 of the first pulse signal output circuit $10\__1$ to the M-th pulse signal output circuit $10\__M$, respectively, and out1 to outM denote outputs from the output terminal 26 of the first pulse signal output circuit $10\__1$ to the M-th pulse signal output circuit $10\__M$, respectively.

The period Tsp and the period Tbp in the timing chart of FIG. 4 are the same as those in FIG. 1C. A period Tv in the timing chart of FIG. 4 is a period during which the first voltage V1 and the second voltage V2 are alternately applied by the threshold voltage control signal Svth in the period Tbp. A period Tc in the timing chart of FIG. 4 is a period during which the gate line clock signal GCLK is fixed to the L signal so as to stop the oscillation of the signal.

In the method for driving the liquid crystal display device according to this embodiment, in the period Tsp, the scan signals Gout1 to GoutM are sequentially output by the gate line clock signal GCLK and the gate line start pulse GSP, and the first voltage V1 can be applied to the back gate by the threshold voltage control signal Svth. In the period Tbp, the gate line clock signal GCLK is fixed to the L signal so as to stop the oscillation of the signals, and the first voltage V1 and the second voltage V2 can be alternately applied to the back gate by the threshold voltage control signal Svth.

Particularly in the timing chart of FIG. 4, in the period Tbp which is the vertical retrace period, the period Tc begins before the period Tv begins, and then the period Tc ends after the period Tv ends. In other words, in the vertical retrace period, after the gate line clock signal is stopped, the first voltage V1 and the second voltage V2 are alternately applied to the back gate; then, the oscillation of the signals by the gate line clock signal begins again. With such a configuration, the gate line clock signal can be fixed to the L signal before the first voltage V1 and the second voltage V2 are alternately applied to the back gate. Accordingly, it is possible to reduce malfunction due to the signal out1 output from the output terminal 26 and the scan signal Gout1 output from the output terminal 27.

By employing the aforementioned method for driving the liquid crystal display device, a voltage for controlling the shift of the threshold voltage of the transistor can be applied in a gate line selection period. Furthermore, it is also possible to reduce degradation of the liquid crystal material caused by a voltage which is applied to the back gate formed using the same conductive film as the pixel electrode and which controls the shift of the threshold voltage.

Figure 5A:
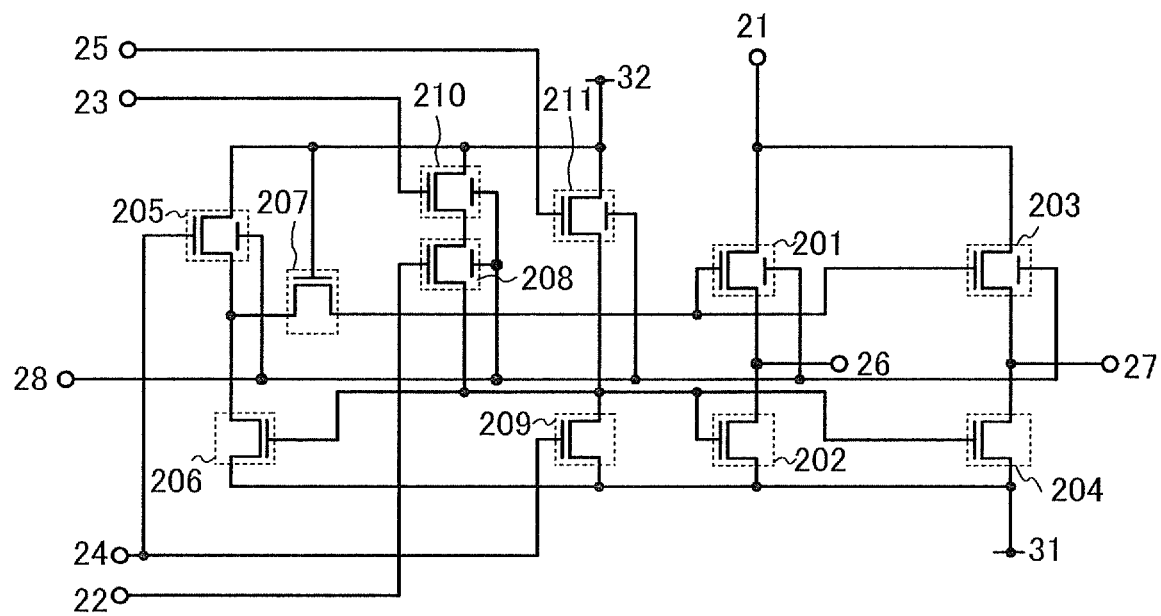
FIGS. 5A and 5B are circuit diagrams each showing a liquid crystal display device.

Note that one embodiment of the present invention is not limited to the structure shown in FIG. 3C in which the back gate is provided for all of the transistors in the pulse signal output circuit. As an example, the conductive film serving as the back gate may be provided for any of the transistors between the power source line 32 and the power source line 31 as shown in FIG. 5A. In FIG. 5A, the transistors 201, 203, 205, 208, 210, and 211 include the conductive film serving as the back gate; however, other structures may also be employed.

Figure 5B:
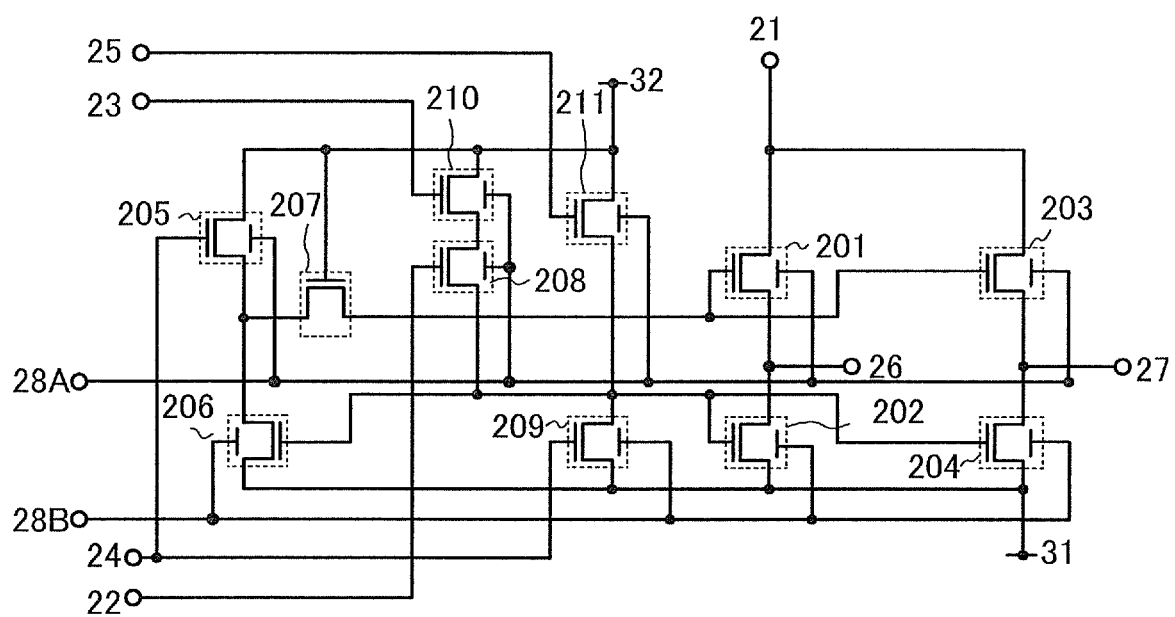

Further, the voltage which is applied to the conductive film serving as the back gate in order that the shift of the threshold voltage is controlled by the threshold voltage control signal Svth, is not limited to the second voltage V2 and may be voltages with different values. In the case of such a configuration, a plurality of signals are prepared to be supplied to the conductive film serving as the back gate, and as shown in FIG. 5B, a first threshold voltage control signal Svth and a second threshold voltage control signal Svth may be input from an input terminal 28A and an input terminal 28B.

In the method for driving the liquid crystal display device described in this embodiment, a voltage for controlling the shift of the threshold voltage of a transistor is applied in a gate line selection period, which results in a reduction in the influence of degradation of the electrical characteristics of the transistor in a driver circuit. In addition, in the method for driving the liquid crystal display device described in this embodiment, it is also possible to reduce degradation of the liquid crystal material caused by a voltage which is applied in the vertical retrace period to the back gate formed using the same conductive film as the pixel electrode and which controls the shift of the threshold voltage.

This embodiment can be implemented in an appropriate combination with any of the structures shown in the other embodiments.

(Embodiment 2)

Explained in this embodiment are structures of transistors in the pixel circuit and the driver circuit which are explained in the above Embodiment 1. In this embodiment, detailed description is made on a structure of a so-called bottom-gate transistor, in particular, steps before a conductive film serving as a back gate is provided.

In a transistor included in the liquid crystal display device shown in the above embodiment, a semiconductor film for forming a channel formation region may be an amorphous, microcrystalline, polycrystalline, or single-crystal semiconductor film of silicon, germanium, or the like, or a semiconductor film of a semiconductor having a wider band gap and lower intrinsic carrier density than silicon. As silicon, any of the following can be used: amorphous silicon formed by a sputtering method or a vapor deposition method such as a plasma CVD method; polycrystalline silicon obtained in such a manner that amorphous silicon is crystallized by laser annealing or the like; single crystal silicon obtained in such a manner that a surface portion of a single crystal silicon wafer is separated by implantation of hydrogen ions or the like into the silicon wafer; and the like.

Alternatively, an oxide semiconductor may be used for the semiconductor film. Having higher field-effect mobility than amorphous silicon, the oxide semiconductor offers a transistor with high on-state current. Further, a transistor using an oxide semiconductor film for a channel formation region can be manufactured by changing only part of the existing equipment for production of amorphous silicon transistors. Therefore, a liquid crystal display device including the transistor using the oxide semiconductor film for the channel formation region can be manufactured without additional spending on equipment and without increasing the manufacturing cost of the transistor.

Hereinafter, an example of a transistor including a channel formation region in an oxide semiconductor film will be described with reference to drawings.

Figure 6A:
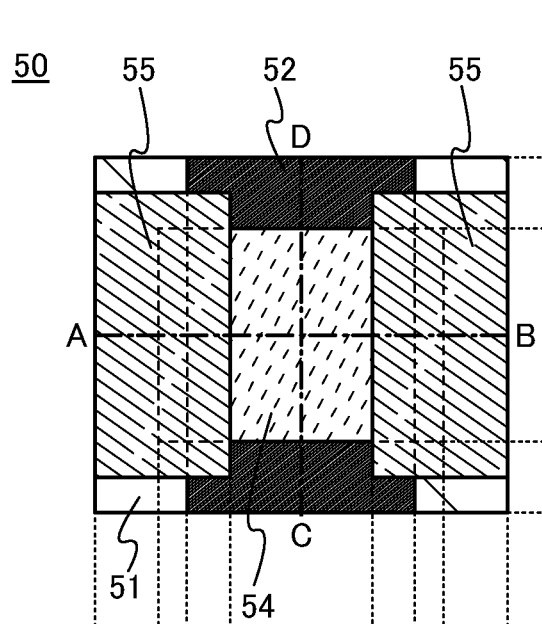
FIG. 6A is a top view and FIGS. 6B and 6C are cross-sectional views, each showing a liquid crystal display device.
Figure 6C:
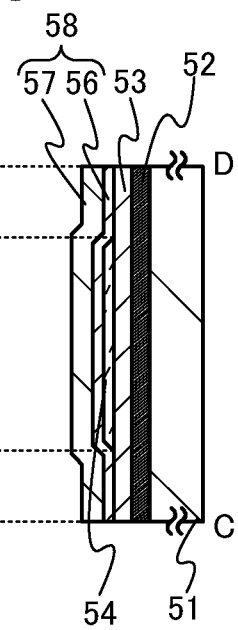
Figure 6B:
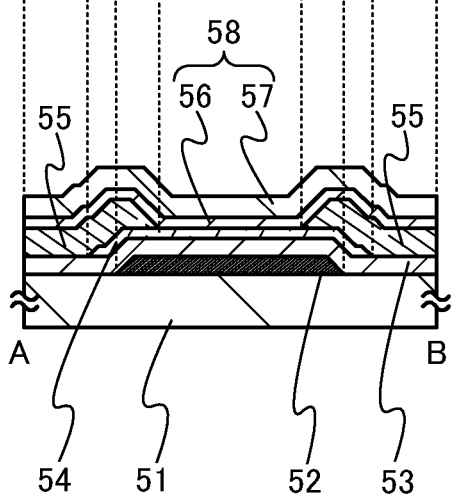

FIGS. 6A to 6C are a top view and cross-sectional views of a transistor 50 including a channel formation region in an oxide semiconductor film. FIG. 6A is a top view of the transistor 50, FIG. 6B is a cross-sectional view taken along dashed line A-B of FIG. 6A, and FIG. 6C is a cross-sectional view taken along dashed line C-D of FIG. 6A. Note that FIG. 6A does not illustrate some components of the transistor 50 (e.g., an insulating film 53, an insulating film 56, and an insulating film 57) for clarity.

The transistor 50 in FIGS. 6B and 6C includes a conductive film 52 serving as a first gate over a substrate 51. The transistor 50 further includes the insulating film 53 over the substrate 51 and the conductive film 52, an oxide semiconductor film 54 which overlaps with the conductive film 52 with the insulating film 53 provided therebetween, and a pair of conductive films 55 which are in contact with the oxide semiconductor film 54 and serve as a source and a drain. A protective film 58 including the insulating films 56 and 57 is formed over the insulating film 53, the oxide semiconductor film 54, and the pair of conductive films 55.

The insulating film 56 is formed in contact with the oxide semiconductor film 54 in the transistor 50 in this embodiment. The insulating film 56 is preferably an oxide insulating film transmitting oxygen. In that case, in the insulating film 56, not all oxygen entering the insulating film 56 from the outside does not move to the outside of the insulating film 56, and some oxygen may remain in the insulating film 56. Alternatively, oxygen enters the insulating film 56 and oxygen contained in the insulating film 56 moves to the outside of the insulating film 56, so that oxygen may move in the insulating film 56.

With the use of an oxide insulating film transmitting oxygen as the insulating film 56, oxygen released from an oxide insulating film which contains oxygen at a higher proportion than the stoichiometric composition and is provided over the insulating film 56 can move to the oxide semiconductor film 54 through the insulating film 56.

As the insulating film 56, a silicon oxide film, a silicon oxynitride film, or the like with a thickness of 5 nm to 150 nm, preferably 5 nm to 50 nm, and more preferably 10 nm to 30 nm can be used.

The insulating film 57 is formed in contact with the insulating film 56. The insulating film 57 is preferably an oxide insulating film which contains oxygen at a higher proportion than the stoichiometric composition. In that case, as the insulating film 57, a silicon oxide film, a silicon oxynitride film, or the like with a thickness of 30 nm to 500 nm, preferably 150 nm to 400 nm can be used.

The oxide insulating film which contains oxygen at a higher proportion than the stoichiometric composition is an oxide insulating film from which part of oxygen is released by heating. Thus, when the oxide insulating film from which part of oxygen is released by heating is provided as the insulating film 57 over the insulating film 56 transmitting oxygen, oxygen can move to the oxide semiconductor film 54 and oxygen vacancies in the oxide semiconductor film 54 can be compensated. Alternatively, when the insulating film 57 is formed over the insulating film 56 transmitting oxygen during heating, oxygen can move to the oxide semiconductor film 54 and oxygen vacancies in the oxide semiconductor film 54 can be compensated. Alternatively, when the insulating film 57 is formed over the insulating film 56 transmitting oxygen and then heated, oxygen can move to the oxide semiconductor film 54 and oxygen vacancies in the oxide semiconductor film 54 can be compensated. Consequently, the amount of oxygen vacancies in the oxide semiconductor film can be reduced.

When the oxide insulating film which contains oxygen at a higher proportion than the stoichiometric composition is provided over a back channel of the oxide semiconductor film 54 (a surface of the oxide semiconductor film 54 which is opposite to a surface facing the conductive film 52) through the oxide insulating film transmitting oxygen, oxygen can move on the back channel side of the oxide semiconductor film 54, and oxygen vacancies on the back channel side can be reduced.

Note that in the case where the oxide semiconductor film 54 is not damaged in the steps of forming the insulating film 57, the insulating film 56 is not necessarily provided and only the insulating film 57 that is an oxide insulating film from which part of oxygen is released by heating may be provided as the protective film.

Note that a transistor including an oxide semiconductor film is an n-channel transistor; thus, in this specification, a transistor which can be regarded as having no drain current flowing therein when the gate voltage is 0 V is defined as a transistor having normally-off characteristics. In contrast, a transistor which can be regarded as having a drain current flowing therein when the gate voltage is 0 V is defined as a transistor having normally-on characteristics.

Other details of the transistor 50 will be described below.

There is no particular limitation on a material and the like of the substrate 51 as long as the material has heat resistance high enough to withstand at least heat treatment performed later. For example, a glass substrate, a ceramic substrate, a quartz substrate, or a sapphire substrate may be used as the substrate 51. Alternatively, a single crystal semiconductor substrate or a polycrystalline semiconductor substrate made of silicon, silicon carbide, or the like, a compound semiconductor substrate made of silicon germanium or the like, an SOI substrate, or the like can be used. Further alternatively, any of these substrates provided with a semiconductor element may be used as the substrate 51.

Still alternatively, a flexible substrate may be used as the substrate 51, and the transistor 50 may be provided directly on the flexible substrate. A separation layer may be provided between the substrate 51 and the transistor 50. The separation layer can be used when part or the whole of a semiconductor device formed over the separation layer is separated from the substrate 51 and transferred onto another substrate. In that case, the transistor 50 can be transferred to a substrate having low heat resistance or a flexible substrate.

A base insulating film may be provided between the substrate 51 and the conductive film 52. Examples of the base insulating film include a silicon oxide film, a silicon oxynitride film, a silicon nitride film, a silicon nitride oxide film, a gallium oxide film, a hafnium oxide film, an yttrium oxide film, an aluminum oxide film, and an aluminum oxynitride film. Note that when a silicon nitride film, a gallium oxide film, a hafnium oxide film, an yttrium oxide film, an aluminum oxide film, or the like is used as the base insulating film, it is possible to inhibit diffusion of impurities such as an alkali metal, water, and hydrogen into the oxide semiconductor film 54 from the substrate 51. In this specification, a silicon oxynitride film means a film which includes more oxygen than nitrogen, and a silicon nitride oxide film means a film which includes more nitrogen than oxygen.

The conductive film 52 can be formed using a metal element selected from aluminum, chromium, copper, tantalum, titanium, molybdenum, or tungsten; an alloy containing any of these metal elements as its component; an alloy containing these metal elements in combination; or the like. Further, one or more metal elements selected from manganese or zirconium may be used. The conductive film 52 may have a single-layer structure or a layered structure of two or more layers. For example, a single-layer structure of an aluminum film containing silicon, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, or a three-layer structure in which a titanium film, an aluminum film, and a titanium film are stacked in that order can be used. Alternatively, a film, an alloy film, or a nitride film that contains aluminum and one or more elements selected from titanium, tantalum, tungsten, molybdenum, chromium, neodymium, and scandium may be used.

Alternatively, the conductive film 52 can be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. It is also possible to employ a layered structure including the light-transmitting conductive material and the metal element.

Further, an In—Ga—Zn-based oxynitride semiconductor film, an In—Sn-based oxynitride semiconductor film, an In—Ga-based oxynitride semiconductor film, an In—Zn-based oxynitride semiconductor film, a Sn-based oxynitride semiconductor film, an In-based oxynitride semiconductor film, or a film of a metal nitride (e.g., InN or ZnN), or the like may be provided between the conductive film 52 and the insulating film 53. These films each have a work function of 5 eV or higher, preferably 5.5 eV or higher which is higher than the electron affinity of the oxide semiconductor. Thus, the threshold voltage of the transistor including an oxide semiconductor can be made to shift in a positive direction, and a so-called normally-off switching element can be achieved. For example, in the case where an In—Ga—Zn-based oxynitride semiconductor film is used, an In—Ga—Zn-based oxynitride semiconductor film having higher nitrogen concentration than at least the oxide semiconductor film 54, specifically, an In—Ga—Zn-based oxynitride semiconductor film having a nitrogen concentration of 7 at. % or higher is used.

The insulating film 53 may be formed to have a single-layer structure or a layered structure using, for example, one or more of a silicon oxide film, a silicon oxynitride film, a silicon nitride oxide film, a silicon nitride film, an aluminum oxide film, a hafnium oxide film, a gallium oxide film, a Ga—Zn-based metal oxide film, and a silicon nitride film. The insulating film 53 may be formed using an oxide insulator from which oxygen is released by heating. With the use of a film from which oxygen is released by heating as the insulating film 53, interface states at the interface between the oxide semiconductor film 54 and the insulating film 53 can be reduced; thus, a transistor with less degradation of electrical characteristics can be obtained. Further, when an insulating film which has an effect of blocking oxygen, hydrogen, water, and the like is used as the insulating film 53, oxygen can be prevented from diffusing from the oxide semiconductor film 54 into the outside, and hydrogen, water, and the like can be prevented from entering the oxide semiconductor film 54 from the outside. As the insulating film which has an effect of blocking oxygen, hydrogen, water, and the like, an aluminum oxide film, an aluminum oxynitride film, a gallium oxide film, a gallium oxynitride film, an yttrium oxide film, an yttrium oxynitride film, a hafnium oxide film, a hafnium oxynitride film, or the like can be used. Further, when an insulating film which has an effect of blocking hydrogen, water, and the like is provided as the insulating film 53, hydrogen, water, and the like can be prevented from entering the oxide semiconductor film 54 from the outside. As the insulating film which has an effect of blocking hydrogen, water, and the like, a silicon nitride film, a silicon nitride oxide film, or the like can be used.

When the insulating film 53 is formed using a high-k material such as hafnium silicate ($HfSiO_x$), hafnium silicate to which nitrogen is added ($HfSi_xO_yN_z$), hafnium aluminate to which nitrogen is added (HfAl$_x$O$_y$N$_z$), hafnium oxide, or yttrium oxide, gate leakage current of the transistor can be reduced.

The thickness of the insulating film 53 is preferably greater than or equal to 5 nm and less than or equal to 400 nm, more preferably greater than or equal to 10 nm and less than or equal to 300 nm, and still more preferably greater than or equal to 50 nm and less than or equal to 250 nm The oxide semiconductor film 54 preferably contains at least indium (In) or zinc (Zn). Alternatively, the oxide semiconductor film 54 preferably contains In and Zn. In order to reduce variations in electrical characteristics of the transistor including the oxide semiconductor, the oxide semiconductor film 54 preferably contains one or more stabilizers in addition to In and/or Zn.

Examples of a stabilizer include gallium (Ga), tin (Sn), hafnium (Hf), aluminum (Al), and zirconium (Zr). Other examples of a stabilizer include lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu).

For example, any of the following can be used as the oxide semiconductor: indium oxide, tin oxide, zinc oxide, an In—Zn-based metal oxide, a Sn—Zn-based metal oxide, an Al—Zn-based metal oxide, a Zn—Mg-based metal oxide, a Sn—Mg-based metal oxide, an In—Mg-based metal oxide, an In—Ga-based metal oxide, an In—W-based metal oxide, an In—Ga—Zn-based metal oxide (also referred to as IGZO), an In—Al—Zn-based metal oxide, an In—Sn—Zn-based metal oxide, a Sn—Ga—Zn-based metal oxide, an Al—Ga—Zn-based metal oxide, a Sn—Al—Zn-based metal oxide, an In—Hf—Zn-based metal oxide, an In—La—Zn-based metal oxide, an In—Ce—Zn-based metal oxide, an In—Pr—Zn-based metal oxide, an In—Nd—Zn-based metal oxide, an In—Sm—Zn-based metal oxide, an In—Eu—Zn-based metal oxide, an In—Gd—Zn-based metal oxide, an In—Tb—Zn-based metal oxide, an In—Dy—Zn-based metal oxide, an In—Ho—Zn-based metal oxide, an In—Er—Zn-based metal oxide, an In—Tm—Zn-based metal oxide, an In—Yb—Zn-based metal oxide, an In—Lu—Zn-based metal oxide, an In—Sn—Ga—Zn-based metal oxide, an In—Hf—Ga—Zn-based metal oxide, an In—Al—Ga—Zn-based metal oxide, an In—Sn—Al—Zn-based metal oxide, an In—Sn—Hf—Zn-based metal oxide, and an In—Hf—Al—Zn-based metal oxide.

Note that, for example, an In—Ga—Zn-based metal oxide means an oxide containing In, Ga, and Zn as its main components and there is no particular limitation on the ratio of In, Ga, and Zn. The In—Ga—Zn-based metal oxide may contain a metal element other than In, Ga, and Zn.

Alternatively, a material represented by InMO$_3$(ZnO)$_m$ (m>0 is satisfied, and m is not an integer) may be used as the oxide semiconductor. Note that M represents one or more metal elements selected from Ga, Fe, Mn, and Co. Alternatively, as the oxide semiconductor, a material represented by In$_2$SnO$_5$(ZnO)$_n$ (n>0 is satisfied, n is an integer) may be used.

For example, it is possible to use an In—Ga—Zn-based metal oxide containing In, Ga, and Zn at an atomic ratio of 1:1:1 (=1/3:1/3:1/3), 2:2:1 (=2/5:2/5:1/5), or 3:1:2 (=1/2:1/6:1/3), or any of oxides whose composition is in the neighborhood of the above compositions. Alternatively, an In—Sn—Zn-based metal oxide containing In, Sn, and Zn at an atomic ratio of 1:1:1 (=1/3:1/3:1/3), 2:1:3 (=1/3:1/6:1/2), or 2:1:5 (=1/4:1/8:5/8), or any of oxides whose composition is in the neighborhood of the above compositions may be used.

However, the composition is not limited to those described above, and a material having an appropriate composition may be used depending on needed electrical characteristics (e.g., field-effect mobility or threshold voltage). In order to obtain needed electrical characteristics, it is preferred that the carrier density, the impurity concentration, the defect density, the atomic ratio of a metal element and oxygen, the interatomic distance, the density, and the like be set to be appropriate.

For example, a high mobility can be obtained relatively easily in the case where the In—Sn—Zn-based metal oxide is used. However, the mobility can be increased by reducing the defect density in the bulk even in the case where the In—Ga—Zn-based metal oxide is used.

Further, the energy gap of a metal oxide which can be used for the oxide semiconductor film 54 is greater than or equal to 2 eV, preferably greater than or equal to 2.5 eV, and more preferably greater than or equal to 3 eV. The off-state current of a transistor can be reduced by using an oxide semiconductor having such a wide energy gap.

A structure of the oxide semiconductor film will be described below.

An oxide semiconductor film is classified roughly into a single-crystal oxide semiconductor film and a non-single-crystal oxide semiconductor film. The non-single-crystal oxide semiconductor film includes any of an amorphous oxide semiconductor film, a microcrystalline oxide semiconductor film, a polycrystalline oxide semiconductor film, a c-axis aligned crystalline oxide semiconductor (CAAC-OS) film, and the like.

The amorphous oxide semiconductor film has disordered atomic arrangement and no crystalline component. A typical example thereof is an oxide semiconductor film in which no crystal part exists even in a microscopic region, and the whole of the film is amorphous.

The microcrystalline oxide semiconductor film includes a microcrystal (also referred to as nanocrystal) with a size greater than or equal to 1 nm and less than 10 nm, for example. Thus, the microcrystalline oxide semiconductor film has a higher degree of atomic order than the amorphous oxide semiconductor film. Hence, the density of defect states of the microcrystalline oxide semiconductor film is lower than that of the amorphous oxide semiconductor film.

The CAAC-OS film is one of oxide semiconductor films including a plurality of crystal parts, and most of the crystal parts each fit inside a cube whose one side is less than 100 nm. Thus, there is a case where a crystal part included in the CAAC-OS film fits inside a cube whose one side is less than 10 nm, less than 5 nm, or less than 3 nm The density of defect states of the CAAC-OS film is lower than that of the microcrystalline oxide semiconductor film. The CAAC-OS film is described in detail below.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer has a morphology reflected by a surface over which the CAAC-OS film is formed (hereinafter, a surface over which the CAAC-OS film is formed is referred to as a formation surface) or a top surface of the CAAC-OS film, and is arranged in parallel to the formation surface or the top surface of the CAAC-OS film.

On the other hand, according to the TEM image of the CAAC-OS film observed in a direction substantially perpendicular to the sample surface (plan TEM image), metal atoms are arranged in a triangular or hexagonal configuration in the crystal parts. However, there is no regularity of arrangement of metal atoms between different crystal parts.

From the results of the cross-sectional TEM image and the plan TEM image, alignment is found in the crystal parts in the CAAC-OS film.

A CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle ($2\theta$) is around 31°. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction perpendicular to the c-axis, a peak appears frequently when $2\theta$ is around 56°. This peak is derived from the (110) plane of the $InGaZnO_4$ crystal. Here, analysis ($\phi$ scan) is performed under conditions where the sample is rotated around a normal vector of a sample surface as an axis ($\phi$ axis) with $2\theta$ fixed at around 56°. In the case where the sample is a single-crystal oxide semiconductor film of $InGaZnO_4$, six peaks appear. The six peaks are derived from crystal planes equivalent to the (110) plane. On the other hand, in the case of a CAAC-OS film, a peak is not clearly observed even when $\phi$ scan is performed with $2\theta$ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface. Thus, for example, in the case where a shape of the CAAC-OS film is changed by etching or the like, the c-axis might not be necessarily parallel to a normal vector of a formation surface or a normal vector of a top surface of the CAAC-OS film.

Further, the degree of crystallinity in the CAAC-OS film is not necessarily uniform. For example, in the case where crystal growth leading to the CAAC-OS film occurs from the vicinity of the top surface of the film, the degree of the crystallinity in the vicinity of the top surface is higher than that in the vicinity of the formation surface in some cases. Further, when an impurity is added to the CAAC-OS film, the crystallinity in a region to which the impurity is added is changed, and the degree of crystallinity in the CAAC-OS film varies depending on regions.

Note that when the CAAC-OS film with an $InGaZnO_4$ crystal is analyzed by an out-of-plane method, a peak of $2\theta$ may also be observed at around 36°, in addition to the peak of $2\theta$ at around 31°. The peak of $2\theta$ at around 36° indicates that a crystal having no c-axis alignment is included in part of the CAAC-OS film. It is preferable that in the CAAC-OS film, a peak of $2\theta$ appear at around 31° and a peak of $2\theta$ do not appear at around 36°.

In a transistor using the CAAC-OS film, a change in electrical characteristics due to irradiation with visible light or ultraviolet light is small. Thus, the transistor has high reliability.

Note that an oxide semiconductor film may be a stacked film including two or more films of an amorphous oxide semiconductor film, a microcrystalline oxide semiconductor film, and a CAAC-OS film, for example.

The oxide semiconductor film 54 may have a layered structure of a plurality of oxide semiconductor films. For example, the oxide semiconductor film 54 may have a layered structure of a first oxide semiconductor film and a second oxide semiconductor film that are formed using metal oxides with different compositions.

Further, the first oxide semiconductor film and the second oxide semiconductor film may include the same constituent elements with different compositions. For example, the first oxide semiconductor film may have an atomic ratio of In:Ga:Zn=1:1:1, and the second oxide semiconductor film may have an atomic ratio of In:Ga:Zn =3:1:2. Alternatively, the first oxide semiconductor film may have an atomic ratio of In:Ga:Zn=1:3:2, and the second oxide semiconductor film may have an atomic ratio of In:Ga:Zn=2:1:3. Note that the proportion of each atom in the atomic ratio of the oxide semiconductor film varies within a range of ±20% as an error.

In that case, one of the first oxide semiconductor film and the second oxide semiconductor film that is closer to the conductive film serving as the first gate (on a channel side) preferably contains In and Ga at a proportion of In>Ga. The other of the first oxide semiconductor film and the second oxide semiconductor film that is farther from the conductive film serving as the first gate (on a back channel side) preferably contains In and Ga at a proportion of In≤Ga.

Further, the oxide semiconductor film 54 may have a three-layer structure of a first oxide semiconductor film, a second oxide semiconductor film, and a third oxide semiconductor film which include the same constituent elements with different compositions. For example, the first oxide semiconductor film may have an atomic ratio of In:Ga:Zn=1:3:2, the second oxide semiconductor film may have an atomic ratio of In:Ga:Zn=3:1:2, and the third oxide semiconductor film may have an atomic ratio of In:Ga:Zn=1:1:1.

An oxide semiconductor film that contains less In than Ga and Zn at an atomic ratio, typically, the first oxide semiconductor film containing In, Ga, and Zn at an atomic ratio of 1:3:2, causes less oxygen vacancies than an oxide semiconductor film containing more In than Ga and Zn at an atomic ratio, typically, the second oxide semiconductor film, and an oxide semiconductor film containing Ga, Zn, and In at the same atomic ratio, typically, the third oxide semiconductor film. Thus, an increase in carrier density can be inhibited. Further, when the first oxide semiconductor film containing In, Ga, and Zn at an atomic ratio of 1:3:2 has an amorphous structure, the second oxide semiconductor film is likely to be a CAAC-OS film.

Since the first oxide semiconductor film, the second oxide semiconductor film, and the third oxide semiconductor film have the same the constituent elements, the first oxide semiconductor film has a few trap levels at the interface with the second oxide semiconductor film. Thus, when the oxide semiconductor film 54 has the above structure, it is possible to reduce the amount of change in threshold voltage of the transistor due to a change over time or a BT photostress test.

In an oxide semiconductor, the s orbital of heavy metal mainly contributes to carrier transfer, and when the In content in the oxide semiconductor is increased, overlap of the s orbitals is likely to be increased. Therefore, an oxide containing In and Ga at a proportion of In>Ga has higher carrier mobility than an oxide containing In and Ga at a proportion of In≤Ga. Further, in Ga, the formation energy of an oxygen vacancy is larger and thus an oxygen vacancy is less likely to occur, than in In; therefore, the oxide containing In and Ga at a proportion of In≤Ga has more stable characteristics than the oxide containing In and Ga at a proportion of In>Ga.

An oxide semiconductor containing In and Ga at a proportion of In>Ga is used on the channel side, and an oxide semiconductor containing In and Ga at a proportion of In≤Ga is used on the back channel side, so that the field-effect mobility and reliability of the transistor can be further improved.

Further, the first oxide semiconductor film, the second oxide semiconductor film, and the third oxide semiconductor film may be formed using oxide semiconductors having different crystallinity. That is, the oxide semiconductor film 54 may be formed using any of a single crystal oxide semiconductor, a polycrystalline oxide semiconductor, an amorphous oxide semiconductor, and a CAAC-OS, as appropriate. When an amorphous oxide semiconductor is used for any of the first oxide semiconductor film, the second oxide semiconductor film, and the third oxide semiconductor film, internal stress or external stress of the oxide semiconductor film 54 is relieved, a change in electrical characteristics of the transistor is reduced, and the reliability of the transistor can be further improved.

The thickness of the oxide semiconductor film 54 is preferably greater than or equal to 1 nm and less than or equal to 100 nm, more preferably greater than or equal to 1 nm and less than or equal to 50 nm, still more preferably greater than or equal to 1 nm and less than or equal to 30 nm, and yet still more preferably greater than or equal to 3 nm and less than or equal to 20 nm The concentration of alkali metals or alkaline earth metals in the oxide semiconductor film 54, which is obtained by secondary ion mass spectrometry (SIMS), is preferably lower than or equal to $1\times10^{18}$ atoms/cm$^3$, more preferably lower than or equal to $2\times10^{16}$ atoms/cm$^3$. This is because, when alkali metals or alkaline earth metals are bonded to an oxide semiconductor, some of the alkali metals or the alkaline earth metals generate carriers and cause an increase in the off-state current of the transistor.

In the oxide semiconductor film 54, the hydrogen concentration obtained by secondary ion mass spectrometry is preferably lower than $5\times10^{18}$ atoms/cm$^3$, more preferably lower than or equal to $1\times10^{18}$ atoms/cm$^3$, still more preferably lower than or equal to $5\times10^{17}$ atoms/cm$^3$, and yet still more preferably lower than or equal to $1\times10^{16}$ atoms/cm$^3$.

Hydrogen contained in the oxide semiconductor film 54 reacts with oxygen bonded to a metal atom to produce water, and a defect is formed in a lattice from which oxygen is released (or a portion from which oxygen is removed). In addition, a bond of part of hydrogen and oxygen causes generation of electrons serving as a carrier. Thus, the impurities containing hydrogen are reduced as much as possible in the step of forming the oxide semiconductor film, resulting in a reduction in the hydrogen concentration in the oxide semiconductor film. By forming a channel region with use of a highly purified oxide semiconductor film from which hydrogen is removed as much as possible, the shift of the threshold voltage in the negative direction can be controlled, and it is possible to reduce the leakage current between a source and a drain of the transistor, typically, the off-state current. As a result, the electrical characteristics of the transistor can be improved.

The oxide semiconductor film 54 may contain nitrogen at a concentration of $5\times10^{18}$ atoms/cm$^3$ or lower.

The pair of conductive films 55 are formed to have a single-layer structure or a layered structure including, as a conductive material, any of metals such as aluminum, titanium, chromium, nickel, copper, yttrium, zirconium, molybdenum, silver, tantalum, and tungsten or an alloy containing any of these metals as its main component. For example, it is possible to use a single-layer structure of an aluminum film containing silicon, a two-layer structure in which a titanium film is stacked over an aluminum film, a two-layer structure in which a titanium film is stacked over a tungsten film, a two-layer structure in which a copper film is formed over a copper-magnesium-aluminum alloy film, a three-layer structure in which a titanium film or a titanium nitride film, an aluminum film or a copper film, and a titanium film or a titanium nitride film are stacked in that order, or a three-layer structure in which a molybdenum film or a molybdenum nitride film, an aluminum film or a copper film, and a molybdenum film or a molybdenum nitride film are stacked in that order. Note that a transparent conductive material containing indium oxide, tin oxide, or zinc oxide may be used.

Note that the transistor 50 in FIGS. 6A to 6C may have, for example, a layout in which the conductive film 52 serving as a gate completely covers the oxide semiconductor film 54 when it is seen from the plane. Such a layout allows light irradiated from the substrate 51 to be completely blocked by the conductive film 52. It is thus possible to reduce degradation of the characteristics of the transistor 50, such as the shift of the threshold voltage.

This embodiment can be implemented in an appropriate combination with any of the structures shown in the other embodiments.

(Embodiment 3)

A liquid crystal display device according to one embodiment of the present invention will be described with reference to a block diagram, a schematic view, and a cross-sectional view corresponding to the schematic view of FIGS. 7A to 7C.

Figure 7A:
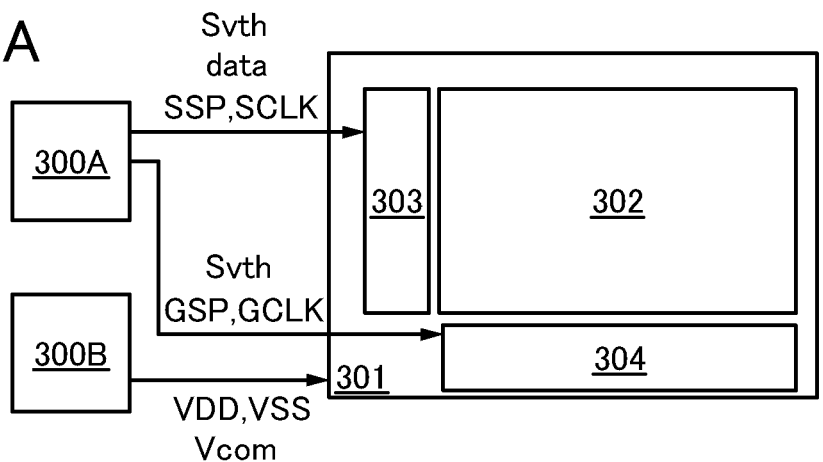
FIGS. 7A to 7C are respectively a block diagram, a schematic view, and a cross-sectional view showing a liquid crystal display device.

FIG. 7A is a block diagram of a liquid crystal display device. In the liquid crystal display device, a pixel circuit 302, a data line driver circuit 303, and a gate line driver circuit 304 are provided over a substrate 301, and a signal generation circuit 300A and a power source circuit 300B are provided to supply a signal, a power source voltage, and the like necessary for the operation of the driver circuits and the pixel circuit.

From the signal generation circuit 300A, for example, a data line image signal data, a threshold voltage control signal Svth, a data line start pulse SSP, and a data line clock signal SCLK are output to the data line driver circuit 303. Also from the signal generation circuit 300A, for example, the threshold voltage control signal Svth, a gate line start pulse GSP, and a gate line clock signal GCLK are output to the gate line driver circuit 304.

From the power source circuit 300B, for example, a high power source voltage VDD, a low power source voltage VSS, and a common voltage Vcom are output to the pixel circuit 302, the data line driver circuit 303, and the gate line driver circuit 304.

Figure 7B:
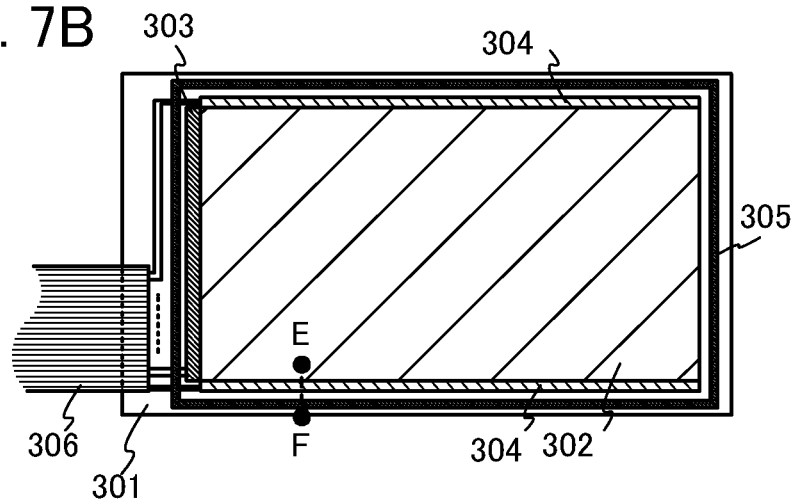
Figure 7C:
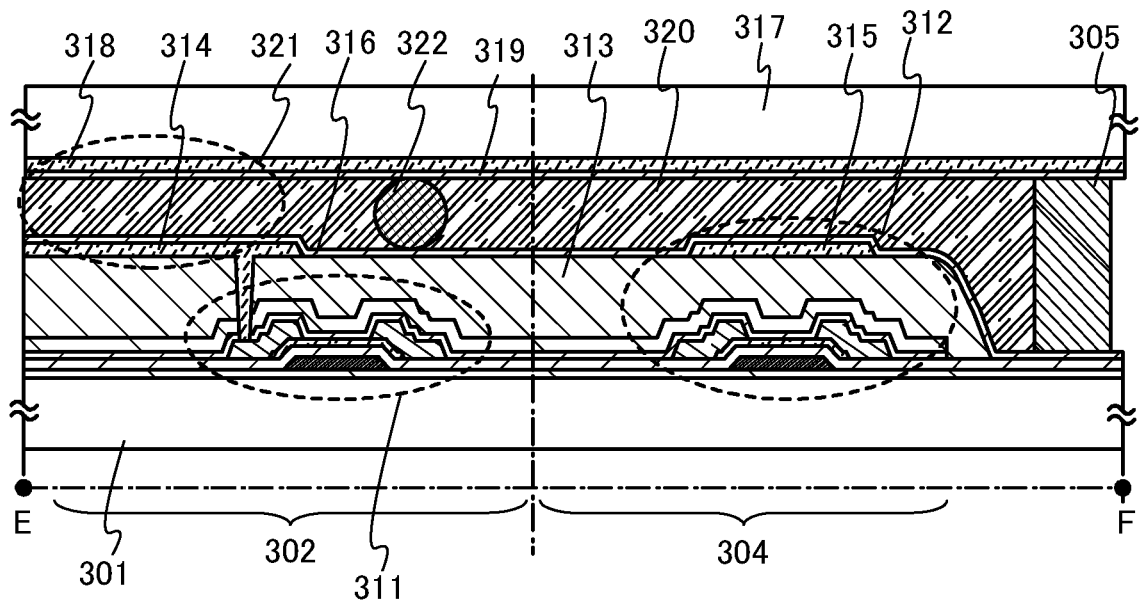

FIG. 7B is a top view of the liquid crystal display device in which the substrate 301 and a substrate 317 are sealed by a sealant 305. FIG. 7C is a cross-sectional view along dashed line E-F of FIG. 7B. Note that a twisted nematic (TN) mode liquid crystal display device is shown in FIGS. 7A to 7C as an example.

The sealant 305 is provided to surround the pixel circuit 302, the data line driver circuit 303, and a pair of gate line driver circuits 304, which are formed over the substrate 301. The substrate 317 is provided over the pixel circuit 302, the data line driver circuit 303, and the gate line driver circuit 304. Therefore, the pixel circuit 302, the data line driver circuit 303, and the gate line driver circuits 304 are sealed by the substrate 301, the sealant 305, and the substrate 317.

The pixel circuit 302 and the gate line driver circuits 304 over the substrate 301 each include a plurality of transistors. In FIG. 7C, a transistor 311 included in the pixel circuit 302 and a transistor 312 included in the gate line driver circuit 304 are shown as examples.

In the pixel circuit 302 and the gate line driver circuit 304, an insulating film 313 made of a resin is provided over the transistors 311 and 312. A first electrode 314 of a liquid crystal element 321 and a conductive film 315 are provided over the insulating film 313. The conductive film 315 is a second gate serving as a back gate of the transistor 312.

Further, an insulating film 316 is provided over the insulating film 313, the first electrode 314, and the conductive film 315. The insulating film 316 serves as an alignment film of a liquid crystal material included in a liquid crystal layer 320.

Moreover, a second electrode 318 of the liquid crystal element 321 is provided over the substrate 317. An insulating film 319 is provided over the second electrode 318. The insulating film 319 serves as an alignment film of the liquid crystal material included in the liquid crystal layer 320.

The liquid crystal layer 320 is provided between the insulating film 316, and the second electrode 318 and the substrate 317. The liquid crystal element 321 includes the first electrode 314, the second electrode 318, and the liquid crystal layer 320.

In the liquid crystal element 321, alignment of liquid crystal molecules in the liquid crystal layer 320 is changed by the value of a voltage applied between the first electrode 314 and the second electrode 318, whereby the transmittance varies. Thus, a gray-scale image can be displayed by the control of the transmittance of the liquid crystal element 321 with use of the voltage of an image signal supplied to the first electrode 314. In addition, a spacer 322 is provided between the first electrode 314 and the second electrode 318 so as to keep the distance between the electrodes. Although the spacer 322 has a spherical shape here, it may have a prismatic or cylindrical shape.

Note that in the liquid crystal display device according to one embodiment of the present invention, a color image may be displayed by using a color filter or by sequentially turning on a plurality of light sources emitting light with different hues.

The image signal, the threshold voltage control signal Svth, and the various control signals and power source voltages are input to the data line driver circuit 303, the gate line driver circuits 304, or the pixel circuit 302 through an FPC 306.

This embodiment can be implemented in an appropriate combination with any of the structures shown in the other embodiments.

(Embodiment 4)

In this embodiment, a display mode of the liquid crystal element shown in Embodiment 3 will be described. Described in Embodiment 3 is an example of the cross section of the twisted nematic (TN) mode liquid crystal element; however, other display modes may also be employed. Hereinafter, description will be made on schematic views of electrodes and substrates used for the operation of liquid crystals with various display modes.

Figure 8A:
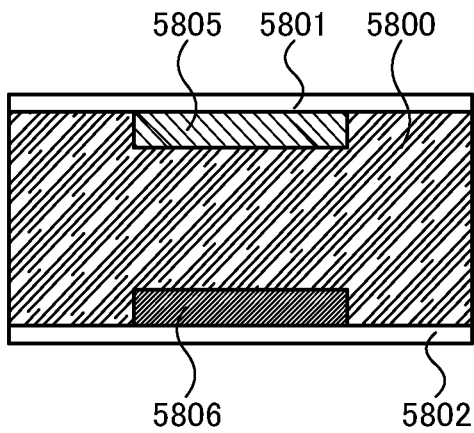
FIGS. 8A to 8E are cross-sectional views showing a liquid crystal element.

FIG. 8A is a cross-sectional schematic view of a TN mode liquid crystal element.

A liquid crystal layer 5800 is held between a first substrate 5801 and a second substrate 5802 which face each other. A first electrode 5805 is formed on the first substrate 5801, and a second electrode 5806 is formed on the second substrate 5802.

Figure 8D:
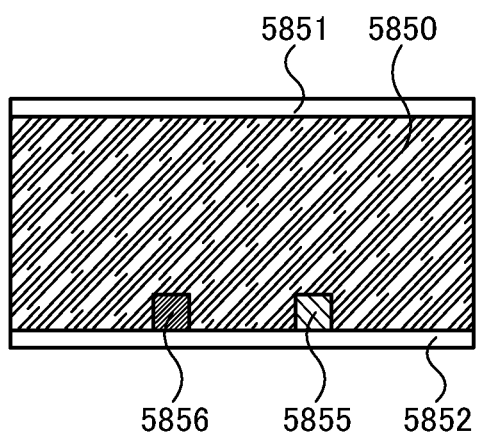
Figure 8B:
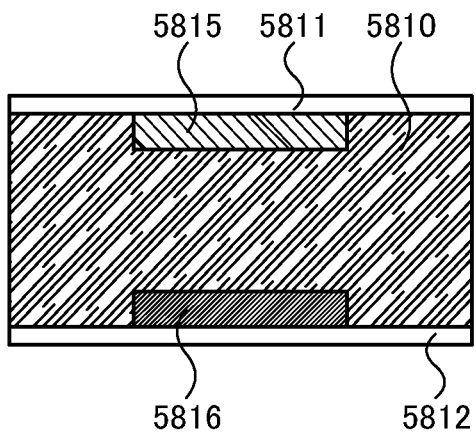

FIG. 8B is a cross-sectional schematic view of a vertical alignment (VA) mode liquid crystal element. When no electric field is applied in the VA mode, liquid crystal molecules are aligned perpendicular to substrates.

A liquid crystal layer 5810 is held between a first substrate 5811 and a second substrate 5812 which face each other. A first electrode 5815 is formed on the first substrate 5811, and a second electrode 5816 is formed on the second substrate 5812.

Figure 8E:
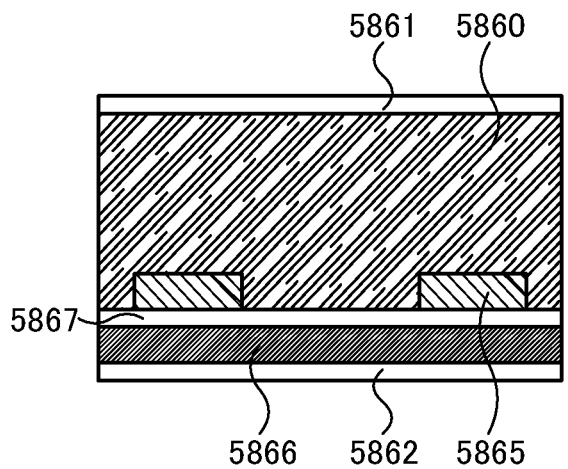
Figure 8C:
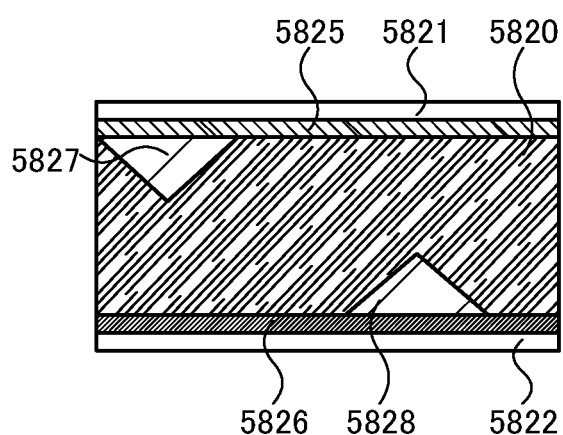

FIG. 8C is a cross-sectional schematic view of a multi-domain vertical alignment (MVA) mode liquid crystal element. In the MVA mode, protrusions are provided so that liquid crystal molecules are aligned in a plurality of directions to compensate the viewing angle dependence.

A liquid crystal layer 5820 is held between a first substrate 5821 and a second substrate 5822 which face each other. A first electrode 5825 is formed on the first substrate 5821, and a second electrode 5826 is formed on the second substrate 5822. A first protrusion 5827 for controlling alignment is formed on the first electrode 5825. A second protrusion 5828 for controlling alignment is formed on the second electrode 5826.

FIG. 8D is a cross-sectional schematic view of an in-plane switching (IPS) mode liquid crystal element. In the IPS mode, liquid crystal molecules always rotate in a plane parallel to substrates. The viewing angle dependence is small because of small difference in refractive index of a liquid crystal layer with varying angles for viewing a screen. The IPS mode employs a horizontal electric field mode in which electrodes are provided only on one substrate.

A liquid crystal layer 5850 is held between a first substrate 5851 and a second substrate 5852 which face each other. A first electrode 5855 and a second electrode 5856 are formed on the second substrate 5852.

In the IPS mode electrode structure, a liquid crystal exhibiting a blue phase for which an alignment film is unnecessary may be used.

FIG. 8E is a cross-sectional schematic view of a fringe field switching (FFS) mode liquid crystal element. In the FFS mode, liquid crystal molecules always rotate in a plane parallel to substrates. The viewing angle dependence is small because of small difference in refractive index of a liquid crystal layer with varying angles for viewing a screen. The FFS mode employs a horizontal electric field mode in which electrodes are provided only on one substrate.

A liquid crystal layer 5860 is held between a first substrate 5861 and a second substrate 5862 which face each other. A second electrode 5866 is formed on the second substrate 5862. An insulating film 5867 is formed on the second electrode 5866, and a first electrode 5865 is formed on the insulating film 5867.

This embodiment can be implemented in an appropriate combination with any of the structures shown in the other embodiments.

(Embodiment 5)

Described in this embodiment are examples of an electronic device including the liquid crystal display device shown in the above embodiments.

Figure 9A:
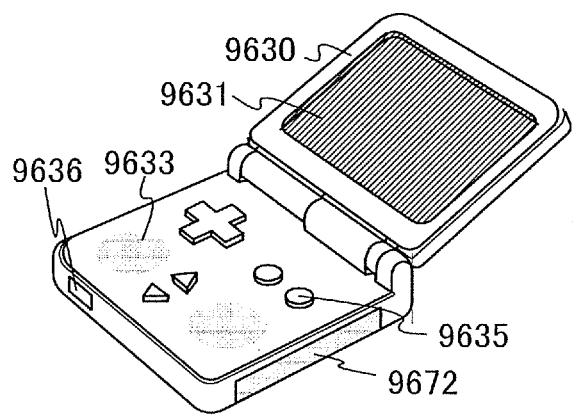
FIGS. 9A to 9C show electronic devices.

FIG. 9A is a portable game machine including a housing 9630, a display portion 9631, speakers 9633, operation keys 9635, a connection terminal 9636, a recording medium reading portion 9672, and the like. The portable game machine shown in FIG. 9A has a function of reading a program or data stored in a recording medium to display it on the display portion, a function of sharing data with another portable game machine by wireless communication, and the like. The portable game machine in FIG. 9A can have various functions without limitation to the above.

Figure 9B:
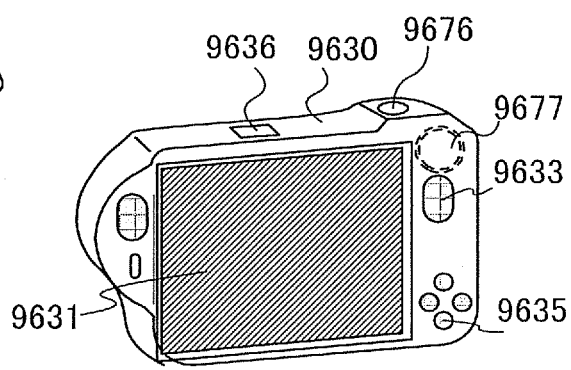

FIG. 9B is a digital camera including the housing 9630, the display portion 9631, the speakers 9633, the operation keys 9635, the connection terminal 9636, a shutter button 9676, an image receiving portion 9677, and the like. The digital camera with a television reception function shown in FIG. 9B has a function of photographing a still image and/or a moving image, a function of automatically or manually correcting the photographed image, a function of obtaining various kinds of information from an antenna, a function of storing the photographed image or the information obtained from the antenna, a function of displaying the photographed image or the information obtained from the antenna on the display portion, and the like. Note that the digital camera with the television reception function shown in FIG. 9B can have a variety of functions without limitation to the above.

Figure 9C:
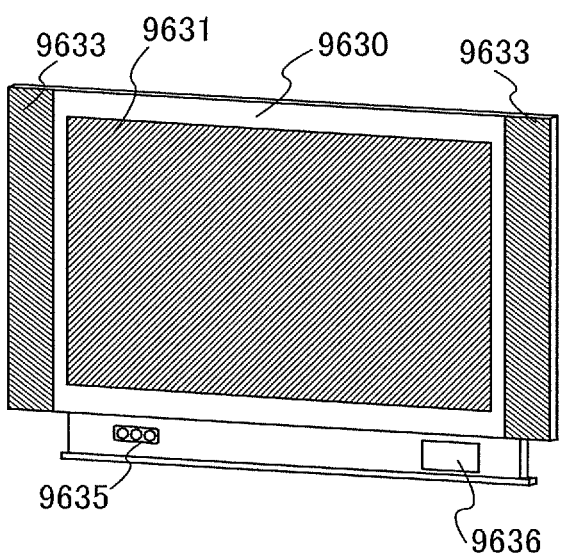

FIG. 9C is a television receiver including the housing 9630, the display portion 9631, the speakers 9633, the operation keys 9635, the connection terminal 9636, and the like. The television receiver shown in FIG. 9C has a function of converting electric waves for television into an image signal, a function of converting an image signal into a signal suitable for display, a function of converting the frame frequency of an image signal, and the like. Note that the television receiver shown in FIG. 9C can have a variety of functions without limitation to the above.

Figure 10A:
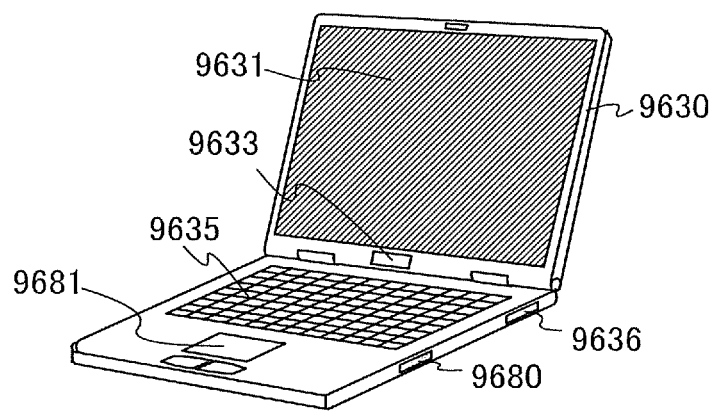
FIGS. 10A to 10C show electronic devices.

FIG. 10A is a computer including the housing 9630, the display portion 9631, the speaker 9633, the operation keys 9635, the connection terminal 9636, a pointing device 9681, an external connecting port 9680, and the like. The computer shown in FIG. 10A has a function of displaying a variety of kinds of data (e.g., a still image, a moving image, and a text image) on the display portion, a function of controlling processing by a variety of kinds of software (programs), a communication function such as wireless communication or wired communication, a function of connecting to various computer networks with the use of the communication function, a function of transmitting or receiving a variety of kinds of data with the use of the communication function, and the like. Note that the computer shown in FIG. 10A can have a variety of functions without limitation to the above.

Figure 10B:
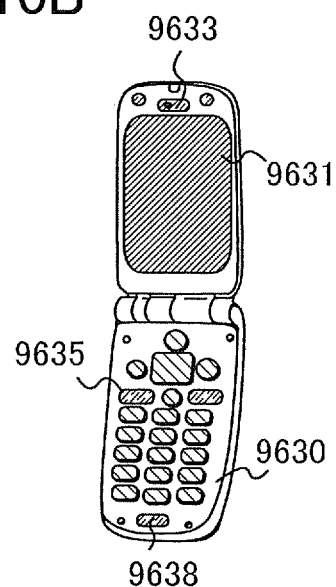

FIG. 10B is a cellular phone including the housing 9630, the display portion 9631, the speaker 9633, the operation keys 9635, a microphone 9638, the external connecting port 9680, and the like. The cellular phone shown in FIG. 10B has a function of displaying a variety of kinds of data (e.g., a still image, a moving image, and a text image) on the display portion, a function of displaying a calendar, a date, the time, and the like on the display portion, a function of operating or editing the data displayed on the display portion, a function of controlling processing by a variety of kinds of software (programs), and the like. Note that the cellular phone shown in FIG. 10B can have a variety of functions without limitation to the above.

Figure 10C:
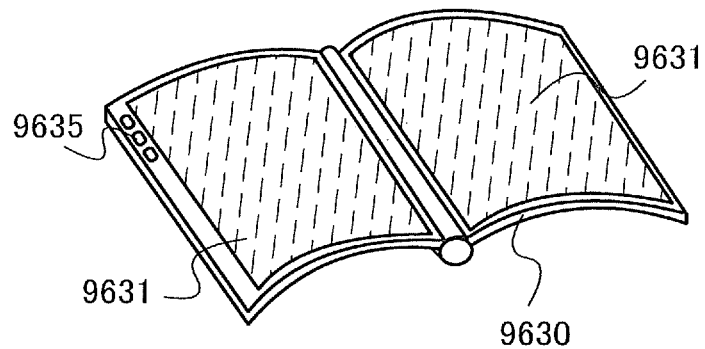

FIG. 10C is electronic paper (also referred to as an e-book reader) including the housing 9630, the display portion 9631, the operation keys 9635, and the like. The electronic paper shown in FIG. 10C has a function of displaying a variety of kinds of data (e.g., a still image, a moving image, and a text image) on the display portion, a function of displaying a calendar, a date, the time, and the like on the display portion, a function of operating or editing the data displayed on the display portion, a function of controlling processing by a variety of kinds of software (programs), and the like. Note that the electronic paper shown in FIG. 10C can have a variety of functions without limitation to the above.

When the electronic devices described in this embodiment are operated by the method for driving the liquid crystal display device according to the above embodiments, it is possible to reduce degradation of the liquid crystal material caused by a voltage which is applied to the back gate formed using the same conductive film as the pixel electrode and which controls the shift of the threshold voltage.

This embodiment can be implemented in an appropriate combination with any of the structures shown in the other embodiments.

This application is based on Japanese Patent Application serial No. 2012-167281 filed with Japan Patent Office on Jul. 27, 2012, the entire contents of which are hereby incorporated by reference.

What is claimed is:

1. A method for driving a liquid crystal display device, the liquid crystal display device comprising:
    a driver circuit including a first transistor and a second transistor each comprising a first gate and a second gate with a semiconductor film between the first gate and the second gate, wherein the second gate of the first transistor and the second gate of the second transistor are back gates which are directly connected to each other,
    the method comprising the steps of:
    applying a first voltage to the second gate of the first transistor and the second gate of the second transistor in a gate line selection period; and
    alternately applying the first voltage and a second voltage to the second gate of the first transistor and the second gate of the second transistor in a vertical retrace period,
    wherein an input of a clock signal to the driver circuit is stopped in the vertical retrace period.

2. The method for driving a liquid crystal display device according to claim 1, wherein a threshold voltage of the first transistor and a threshold voltage of the second transistor shift in a positive direction when applying the first voltage to the second gate of the first transistor and the second gate of the second transistor in the gate line selection period.

3. The method for driving a liquid crystal display device according to claim 1, wherein the first voltage is a ground voltage.

4. The method for driving a liquid crystal display device according to claim 1, wherein the second voltage is higher than the first voltage.

5. The method for driving a liquid crystal display device according to claim 1, wherein the semiconductor film is an oxide semiconductor film.

6. The method for driving a liquid crystal device according to claim 1, wherein the first voltage is applied at the time of switching between the gate line selection period and the vertical retrace period.

7. The method for driving a liquid crystal display device according to claim 1, the liquid crystal display device further comprising a liquid crystal layer overlapping with the second gate of the first transistor and the second gate of the second transistor.

8. A method for driving a liquid crystal display device, the liquid crystal display device comprising:
  a pixel circuit including a pixel electrode; and
  a driver circuit including a first transistor and a second transistor each comprising a first gate and a second gate with a semiconductor film between the first gate and the second gate, wherein the second gate of the first transistor and the second gate of the second transistor are back gates which are directly connected to each other and formed from the same layer as the pixel electrode, the method comprising the steps of:
  applying a first voltage to the second gate of the first transistor and the second gate of the second transistor in a gate line selection period; and
  alternately applying the first voltage and a second voltage to the second gate of the first transistor and the second gate of the second transistor in a vertical retrace period,
  wherein an input of a clock signal to the driver circuit is stopped in the vertical retrace period.

9. The method for driving a liquid crystal display device according to claim 8, wherein a threshold voltage of the first transistor and a threshold voltage of the second transistor shift in a positive direction when applying the first voltage to the second gate of the first transistor and the second gate of the second transistor in the gate line selection period.

10. The method for driving a liquid crystal display device according to claim 8, wherein the first voltage is a ground voltage.

11. The method for driving a liquid crystal display device according to claim 8, wherein the second voltage is higher than the first voltage.

12. The method for driving a liquid crystal display device according to claim 8, wherein the semiconductor film is an oxide semiconductor film.

13. The method for driving a liquid crystal device according to claim 8, wherein the first voltage is applied at the time of switching between the gate line selection period and the vertical retrace period.

14. The method for driving a liquid crystal display device according to claim 8, the liquid crystal display device further comprising a liquid crystal layer overlapping with the second gate of the first transistor and the second gate of the second transistor.

* * * * *

UNITED STATES PATENT AND TRADEMARK OFFICE
CERTIFICATE OF CORRECTION

| | |
|---|---|
| PATENT NO. | : 9,299,296 B2 |
| APPLICATION NO. | : 13/949258 |
| DATED | : March 29, 2016 |
| INVENTOR(S) | : Shunpei Yamazaki et al. |

It is certified that error appears in the above-identified patent and that said Letters Patent is hereby corrected as shown below:

In the specification,

At column 15, line 8, "250 nm" should be --250 nm.--;

At column 16, line 48, "3 nm" should be --3 nm.--;

At column 17, lines 31-32, "0 scan" should be --ø scan--;

At column 19, line 38, "20 nm" should be --20 nm.--;

In the claims,

In claim 6, at column 24, line 59, "a liquid crystal device" should be --a liquid crystal display device--;

In claim 13, at column 26, line 13, "a liquid crystal device" should be --a liquid crystal display device--.

Signed and Sealed this
Twelfth Day of July, 2016

Michelle K. Lee
*Director of the United States Patent and Trademark Office*